(12) United States Patent
Tran

(10) Patent No.: US 9,941,155 B2
(45) Date of Patent: Apr. 10, 2018

(54) METHODS FOR ISOLATING PORTIONS OF A LOOP OF PITCH-MULTIPLIED MATERIAL AND RELATED STRUCTURES

(71) Applicant: Micron Technology, Inc., Boise, ID (US)

(72) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/596,288

(22) Filed: May 16, 2017

(65) Prior Publication Data

US 2017/0250110 A1    Aug. 31, 2017

Related U.S. Application Data

(60) Division of application No. 14/592,498, filed on Jan. 8, 2015, now Pat. No. 9,666,695, which is a
(Continued)

(51) Int. Cl.
*H01L 27/115* (2017.01)
*H01L 27/07* (2006.01)
(Continued)

(52) U.S. Cl.
CPC .. *H01L 21/76816* (2013.01); *H01L 21/76877* (2013.01); *H01L 23/528* (2013.01);
(Continued)

(58) Field of Classification Search
CPC ......... H01L 21/76846; H01L 27/11524; H01L 27/11529; H01L 27/11546; H01L 23/528;
(Continued)

(56) References Cited

U.S. PATENT DOCUMENTS 4,234,362 A    11/1980   Riseman
4,419,809 A    12/1983   Riseman et al.
(Continued)

FOREIGN PATENT DOCUMENTS

CN    1450647    10/2003
CN    1518771    8/2004
(Continued)

OTHER PUBLICATIONS

CN 200880121431.6 OA/SR &Trans, dated Apr. 22, 2013, Micron Technology, Inc.
(Continued)

*Primary Examiner* — Thanhha Pham
(74) *Attorney, Agent, or Firm* — Wells St. John P.S.

(57) ABSTRACT

Different portions of a continuous loop of semiconductor material are electrically isolated from one another. In some embodiments, the end of the loop is electrically isolated from mid-portions of the loop. In some embodiments, loops of semiconductor material, having two legs connected together at their ends, are formed by a pitch multiplication process in which loops of spacers are formed on sidewalls of mandrels. The mandrels are removed and a block of masking material is overlaid on at least one end of the spacer loops. In some embodiments, the blocks of masking material overlay each end of the spacer loops. The pattern defined by the spacers and the blocks are transferred to a layer of semiconductor material. The blocks electrically connect together all the loops. A select gate is formed along each leg of the loops. The blocks serve as sources/drains. The select gates are biased in the off state to prevent current flow from the mid-portion of the loop's legs to the blocks, thereby electrically isolating the mid-portions from the ends of the loops and also electrically isolating different legs of a loop from each other.

7 Claims, 35 Drawing Sheets

Related U.S. Application Data continuation of application No. 13/777,803, filed on Feb. 26, 2013, now Pat. No. 8,932,960, which is a division of application No. 12/845,167, filed on Jul. 28, 2010, now Pat. No. 8,390,034, which is a division of application No. 11/959,409, filed on Dec. 18, 2007, now Pat. No. 7,790,531.

(51) Int. Cl.

| *H01L 21/768* | (2006.01) |
|---|---|
| *H01L 23/528* | (2006.01) |
| *H01L 27/11524* | (2017.01) |
| *H01L 27/11529* | (2017.01) |
| *H01L 27/11546* | (2017.01) |
| *H01L 23/522* | (2006.01) |
| *H01L 27/1157* | (2017.01) |

(52) U.S. Cl.
CPC ...... *H01L 23/5226* (2013.01); *H01L 27/0705* (2013.01); *H01L 27/1157* (2013.01); *H01L 27/11524* (2013.01); *H01L 27/11529* (2013.01); *H01L 27/11546* (2013.01)

(58) Field of Classification Search
CPC ........... H01L 27/0705; H01L 27/11565; H01L 27/1157
See application file for complete search history.

(56) References Cited

U.S. PATENT DOCUMENTS

| 4,432,132 | A | 2/1984 | Kinsbron et al. |
|---|---|---|---|
| 4,502,914 | A | 3/1985 | Trumpp et al. |
| 4,508,579 | A | 4/1985 | Goth et al. |
| 4,648,937 | A | 3/1987 | Ogura et al. |
| 4,716,131 | A | 12/1987 | Okazawa et al. |
| 4,776,922 | A | 10/1988 | Bhattacharyya et al. |
| 4,803,181 | A | 2/1989 | Buchmann et al. |
| 4,838,991 | A | 6/1989 | Cote et al. |
| 5,013,680 | A | 5/1991 | Lowrey et al. |
| 5,053,105 | A | 10/1991 | Fox, III |
| 5,117,027 | A | 5/1992 | Bernhardt et al. |
| 5,328,810 | A | 7/1994 | Lowrey et al. |
| 5,330,879 | A | 7/1994 | Dennison |
| 5,470,661 | A | 11/1995 | Bailey et al. |
| 5,514,885 | A | 5/1996 | Myrick |
| 5,593,813 | A | 1/1997 | Kim |
| 5,670,794 | A | 9/1997 | Manning |
| 5,753,546 | A | 5/1998 | Koh et al. |
| 5,789,320 | A | 8/1998 | Andricacos et al. |
| 5,795,830 | A | 8/1998 | Cronin et al. |
| 5,830,332 | A | 11/1998 | Babich et al. |
| 5,858,620 | A | 1/1999 | Ishibashi et al. |
| 5,895,740 | A | 4/1999 | Chien et al. |
| 5,899,746 | A | 5/1999 | Mukai |
| 5,998,256 | A | 12/1999 | Juengling |
| 6,004,862 | A | 12/1999 | Kim et al. |
| 6,010,946 | A | 1/2000 | Hisamune et al. |
| 6,020,255 | A | 2/2000 | Tsai et al. |
| 6,042,998 | A | 3/2000 | Brueck et al. |
| 6,057,573 | A | 5/2000 | Kirsch et al. |
| 6,063,688 | A | 5/2000 | Doyle et al. |
| 6,071,789 | A | 6/2000 | Yang et al. |
| 6,110,837 | A | 8/2000 | Linliu et al. |
| 6,143,476 | A | 11/2000 | Ye et al. |
| 6,207,490 | B1 | 3/2001 | Lee |
| 6,211,044 | B1 | 4/2001 | Xiang et al. |
| 6,288,454 | B1 | 9/2001 | Allman et al. |
| 6,291,334 | B1 | 9/2001 | Somekh |
| 6,297,554 | B1 | 10/2001 | Lin |
| 6,335,257 | B1 | 1/2002 | Tseng |
| 6,348,380 | B1 | 2/2002 | Weimer et al. |
| 6,362,057 | B1 | 3/2002 | Taylor, Jr. et al. |
| 6,383,907 | B1 | 5/2002 | Hasegawa et al. |
| 6,395,613 | B1 | 5/2002 | Juengling |
| 6,423,474 | B1 | 7/2002 | Holscher |
| 6,455,372 | B1 | 9/2002 | Weimer |
| 6,500,756 | B1 | 12/2002 | Bell et al. |
| 6,514,884 | B2 | 2/2003 | Maeda |
| 6,522,584 | B1 | 2/2003 | Chen et al. |
| 6,534,243 | B1 | 3/2003 | Templeton |
| 6,548,385 | B1 | 4/2003 | Lai |
| 6,548,396 | B2 | 4/2003 | Naik et al. |
| 6,559,017 | B1 | 5/2003 | Brown et al. |
| 6,566,280 | B1 | 5/2003 | Meagley et al. |
| 6,573,030 | B1 | 6/2003 | Fairbairn et al. |
| 6,602,779 | B1 | 8/2003 | Li et al. |
| 6,620,715 | B1 | 9/2003 | Blosse et al. |
| 6,632,741 | B1 | 10/2003 | Clevenger et al. |
| 6,638,441 | B2 | 10/2003 | Chang et al. |
| 6,667,237 | B1 | 12/2003 | Metzler |
| 6,673,684 | B1 | 1/2004 | Huang et al. |
| 6,686,245 | B1 | 2/2004 | Mathew et al. |
| 6,689,695 | B1 | 2/2004 | Lui et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,762,449 | B2 | 7/2004 | Uchiyama et al. |
| 6,773,998 | B1 | 8/2004 | Fisher et al. |
| 6,818,141 | B1 | 11/2004 | Plat et al. |
| 6,835,662 | B1 | 12/2004 | Erhardt et al. |
| 6,864,545 | B2 | 3/2005 | Yamashita |
| 6,867,116 | B1 | 3/2005 | Chung |
| 6,875,703 | B1 | 4/2005 | Furukawa et al. |
| 6,893,972 | B2 | 5/2005 | Rottstegge et al. |
| 6,916,594 | B2 | 7/2005 | Bok |
| 6,924,191 | B2 | 8/2005 | Lui et al. |
| 6,955,961 | B1 | 10/2005 | Chung |
| 6,962,867 | B2 | 11/2005 | Jackson et al. |
| 7,015,124 | B1 | 3/2006 | Fisher et al. |
| 7,074,668 | B1 | 7/2006 | Park et al. |
| 7,105,431 | B2 | 9/2006 | Yin et al. |
| 7,115,525 | B2 | 10/2006 | Abatchev et al. |
| 7,151,040 | B2 | 12/2006 | Tran et al. |
| 7,183,142 | B2 | 2/2007 | Anderson |
| 7,183,205 | B2 | 2/2007 | Hong |
| 7,183,597 | B2 | 2/2007 | Doyle |
| 7,202,174 | B1 | 4/2007 | Jung |
| 7,208,379 | B2 | 4/2007 | Venugopal et al. |
| 7,253,118 | B2 | 8/2007 | Tran et al. |
| 7,271,107 | B2 | 9/2007 | Marks et al. |
| 7,288,445 | B2 | 10/2007 | Bryant et al. |
| 7,291,560 | B2 | 11/2007 | Parascandola et al. |
| 7,294,888 | B1 | 11/2007 | Paak et al. |
| 7,298,004 | B2 | 11/2007 | Specht et al. |
| 7,315,055 | B2 | 1/2008 | Cho et al. |
| 7,358,121 | B2 | 4/2008 | Chau et al. |
| 7,378,727 | B2 | 5/2008 | Caspary et al. |
| 7,394,116 | B2 | 7/2008 | Kim et al. |
| 7,442,976 | B2 | 10/2008 | Juengling |
| 7,537,866 | B2 | 5/2009 | King Liu |
| 7,829,262 | B2 * | 11/2010 | Tran .................. H01L 21/0337 430/311 |
| 7,851,135 | B2 | 12/2010 | Jung |
| 8,129,289 | B2 | 3/2012 | Smythe et al. |
| 8,390,034 | B2 | 3/2013 | Tran |
| 8,884,966 | B2 | 11/2014 | Hao et al. |
| 8,932,960 | B2 | 1/2015 | Tran |
| 2002/0042198 | A1 | 4/2002 | Bjarnason et al. |
| 2002/0045308 | A1 | 4/2002 | Juengling |
| 2002/0063110 | A1 | 5/2002 | Cantell et al. |
| 2002/0068243 | A1 | 6/2002 | Hwang et al. |
| 2002/0094688 | A1 | 7/2002 | Mitsuiki |
| 2002/0127810 | A1 | 9/2002 | Nakamura |
| 2003/0006410 | A1 | 1/2003 | Doyle |
| 2003/0044722 | A1 | 3/2003 | Hsu et al. |
| 2003/0109102 | A1 | 6/2003 | Kujirai et al. |
| 2003/0119307 | A1 | 6/2003 | Bekiaris et al. |
| 2003/0127426 | A1 | 7/2003 | Chang et al. |
| 2003/0146461 | A1 | 8/2003 | Beer et al. |
| 2003/0157436 | A1 | 8/2003 | Manger et al. |
| 2003/0189233 | A1 | 10/2003 | Yamashita |

(56) References Cited

U.S. PATENT DOCUMENTS

| | | |
|---|---|---|
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036126 A1 | 2/2004 | Chau et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0223363 A1 | 11/2004 | Peng |
| 2004/0235255 A1 | 11/2004 | Tanaka et al. |
| 2005/0074949 A1 | 4/2005 | Jung et al. |
| 2005/0104117 A1 | 5/2005 | Mikolajick et al. |
| 2005/0112812 A1 | 5/2005 | Jang |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0167394 A1 | 8/2005 | Liu et al. |
| 2005/0186705 A1 | 8/2005 | Jackson et al. |
| 2005/0199949 A1 | 9/2005 | Chau et al. |
| 2005/0272259 A1 | 12/2005 | Hong |
| 2005/0285204 A1 | 12/2005 | Kim et al. |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0110880 A1 | 5/2006 | Yuan |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0240361 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0001219 A1 | 1/2007 | Radosavljevic |
| 2007/0003881 A1 | 1/2007 | Ito et al. |
| 2007/0026672 A1 | 2/2007 | Tang et al. |
| 2007/0045712 A1 | 3/2007 | Haller et al. |
| 2007/0045736 A1 | 3/2007 | Yagashita |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050745 A1 | 3/2007 | Dinter et al. |
| 2007/0077524 A1 | 4/2007 | Koh |
| 2007/0087502 A1 | 4/2007 | Chung-Zen |
| 2007/0148968 A1 | 6/2007 | Kwon et al. |
| 2007/0190762 A1 | 8/2007 | Franciscus Van Haren |
| 2007/0205438 A1 | 9/2007 | Juengling |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0228455 A1 | 10/2007 | Sasago et al. |
| 2007/0238308 A1 | 10/2007 | Niroomand et al. |
| 2007/0249170 A1 | 10/2007 | Kewley |
| 2007/0261016 A1 | 11/2007 | Sandhu et al. |
| 2007/0275309 A1 | 11/2007 | Liu |
| 2007/0281219 A1 | 12/2007 | Sandhu |
| 2008/0054350 A1 | 3/2008 | Breitwisch et al. |
| 2008/0057610 A1 | 3/2008 | Lee et al. |
| 2008/0057692 A1 | 3/2008 | Wells et al. |
| 2008/0070165 A1 | 3/2008 | Fischer et al. |
| 2008/0081461 A1 | 4/2008 | Lee et al. |
| 2008/0179635 A1 | 7/2008 | Gossner |
| 2008/0292991 A1 | 11/2008 | Wallow |
| 2008/0299774 A1 | 12/2008 | Sandhu |
| 2009/0035665 A1 | 2/2009 | Tran |
| 2009/0115064 A1 | 5/2009 | Sandhu et al. |
| 2009/0149026 A1 | 6/2009 | Zhou et al. |
| 2009/0152645 A1 | 6/2009 | Tran |
| 2009/0194824 A1 | 8/2009 | Wirbeleit |

FOREIGN PATENT DOCUMENTS

| | | |
|---|---|---|
| CN | 1750269 | 3/2006 |
| CN | 1905193 | 1/2007 |
| DE | 4236609 | 5/1994 |
| EP | 0227303 | 7/1987 |
| EP | 0491408 | 6/1992 |
| EP | 1357433 | 10/2003 |
| JP | 57-048237 | 3/1982 |
| JP | 64-035916 | 2/1989 |
| JP | 04-014255 | 1/1992 |
| JP | 04-307969 | 10/1992 |
| JP | 05-343370 | 12/1993 |
| JP | H8-55908 | 2/1996 |
| JP | H8-55920 | 2/1996 |
| JP | 11-097652 | 4/1999 |
| JP | 2000-208434 | 7/2000 |
| JP | 2000-357736 | 12/2000 |
| JP | 2002-208646 | 7/2002 |
| JP | 2004-080033 | 3/2004 |
| JP | 2004-152784 | 5/2004 |
| JP | 2005-150333 | 6/2005 |
| JP | 2006-237196 | 9/2006 |
| JP | 2006-351861 | 12/2006 |
| JP | 2007-273859 | 10/2007 |
| JP | 2008-218569 | 9/2008 |
| JP | 2009-054956 | 3/2009 |
| KR | 1995-0034748 | 12/1995 |
| KR | 10-0122315 | 9/1997 |
| KR | 1999-0001440 | 1/1999 |
| KR | 1999-027887 | 4/1999 |
| KR | 10-2005-0052213 | 6/2005 |
| KR | 10-0546409 | 1/2006 |
| SG | 2010-042356 | 11/2011 |
| TW | 200735175 | 9/2007 |
| WO | WO 92/02044 | 2/1992 |
| WO | WO 94/15261 | 7/1994 |
| WO | WO 02/099864 | 12/2002 |
| WO | WO 2004/003977 | 1/2004 |
| WO | WO 2004/001799 | 12/2004 |
| WO | WO 2005/034215 | 4/2005 |
| WO | WO 2006/026699 | 3/2006 |
| WO | WO 2006/070474 | 7/2006 |
| WO | WO 2006/101695 | 9/2006 |
| WO | WO 2009/079517 | 6/2009 |

OTHER PUBLICATIONS

CN 200880121431.6 OA/SR &Trans, dated Oct. 28, 2013, Micron Technology, Inc.
EP 08861157 Office Action, dated Nov. 6, 2013, Micron Technology, Inc.
EP 08861157.9 Supp Search Rept, dated Feb. 3, 2011, Micron Technology, Inc.
JP 2010-539709 OA w/Trans., dated Aug. 27, 2013, Micron Technology, Inc.
JP 2013-242620 OA and Trans, dated Oct. 21, 2014, Micron Technology, Inc.
WO PCT/US2008/087029 IPRP, dated Jun. 22, 2010, Micron Technology, Inc.
WO PCT/US2008/087029 SR and WO, dated Jul. 27, 2009, Micron Technology Inc.

(56) References Cited

OTHER PUBLICATIONS

SG 2010-042356 SR and WO, dated Nov. 10, 2011, Micron Technology, Inc.
TW 097149200 OA and SR Trans, dated Nov. 26, 2014, Micron Technology, Inc.
Bergeron et al., "Resolution Enhancement Techniques for the 90nm Technology Node and Beyond", Lithography Equipment and Materials, Futre Fab International Issue 15, Jul. 11, 2003, United States, 4 pages.
Bhave et al., "Developer-Soluble Gap Fill Materials for Patterning Metal Trenches in Via-First Dual Damascene Process", preprint of Proceedings of SPIE: Advances in Resist Technology and Processing XXI vol. 5376, 2004, United States, 8 pages.
Bruek, "Optical and Interferometric Lithography—Nanotechnology Enablers," Proceedings of the IEEE vol. 93, No. 10, Oct. 2005, United States, pp. 1704-1721.
Cerofolini et al., "Strategies for Nanoelectronics", Microelectronic Engineering vol. 81, Apr. 2005, Netherlands, pp. 405-419.
Choi et al., "Sublithographic Nanofabrication Technology for Nanocatalysts and DNA Chips", Journal of Vacuum Science & Technology B: Nanotechnology and Microelectronics, Nov./Dec. 2003, United States, pp. 2951-2955.
Chung et al., "Nanoscale Multi-Line Patterning using Sidewall Structure," Japan Journal of Applied Physics vol. 41, Pt. 1, No. 6B, 2002, Japan, pp. 4410-4414.
Chung et al., "Pattern Multiplication Method and the Uniformity of Nanoscale Multiple Lines," Journal of Vacuum Science & Technology B: Nanotechnology and Microelectronics, Jul./Aug. 2003, United States, pp. 1491-1495.
*Ex Parte Cantell*, Unpublished Decision of the Board of Patent Appeals and Interferences, Mar. 4, 2005, 11 pages.
Helmbold et al., "Optical Absorption of Amorphous Hydrogenated Carbon Thin Films", Thin Solid Films 283, 1996, Netherlands, pp. 196-203.
Joubert et al., "Nanometer Scale Linewidth Control During Etching of Polysilicon Gates in High-Density Plasmas", Microelectronic Engineering vol. 69, 2003, Netherlands, pp. 350-357.
Oehrlein et al., "Pattern Transfer into Low Dielectric Materials by High-Density Plasma Etching", Solid State Technology, May 2000, United States, 8 pages.
Sheats et al., "Microlithography: Science and Technology", Marcel Dekkar, Inc., 1998, United States, pp. 104-105.
U.S. Appl. No. 11/219,067 Office Action, dated Jun. 2, 2008, 8 pages.
U.S. Appl. No. 11/367,020 Final Office Action, dated Jul. 11, 2008, 18 pages.
U.S. Appl. No. 11/514,117 Office Action, dated Jun. 5, 2008, 10 pages.

\* cited by examiner

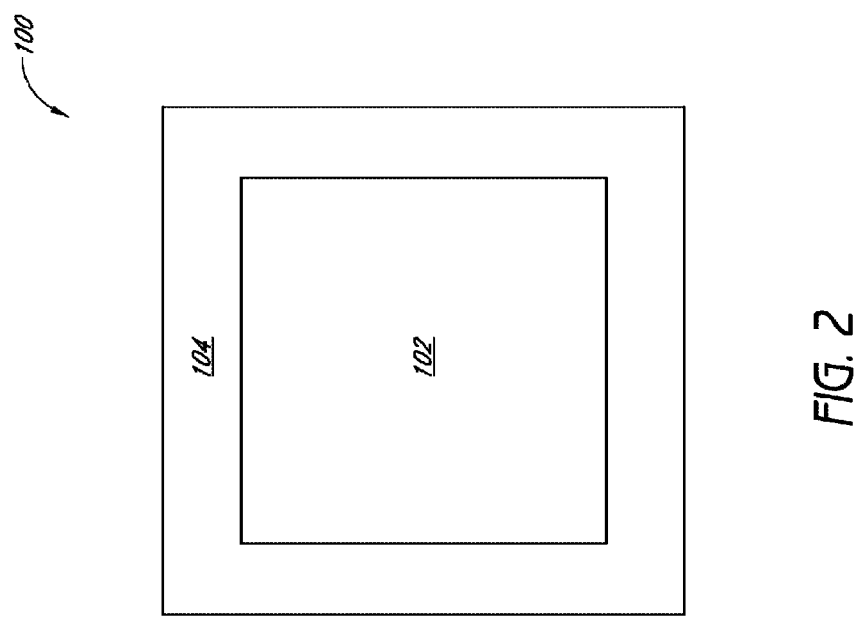

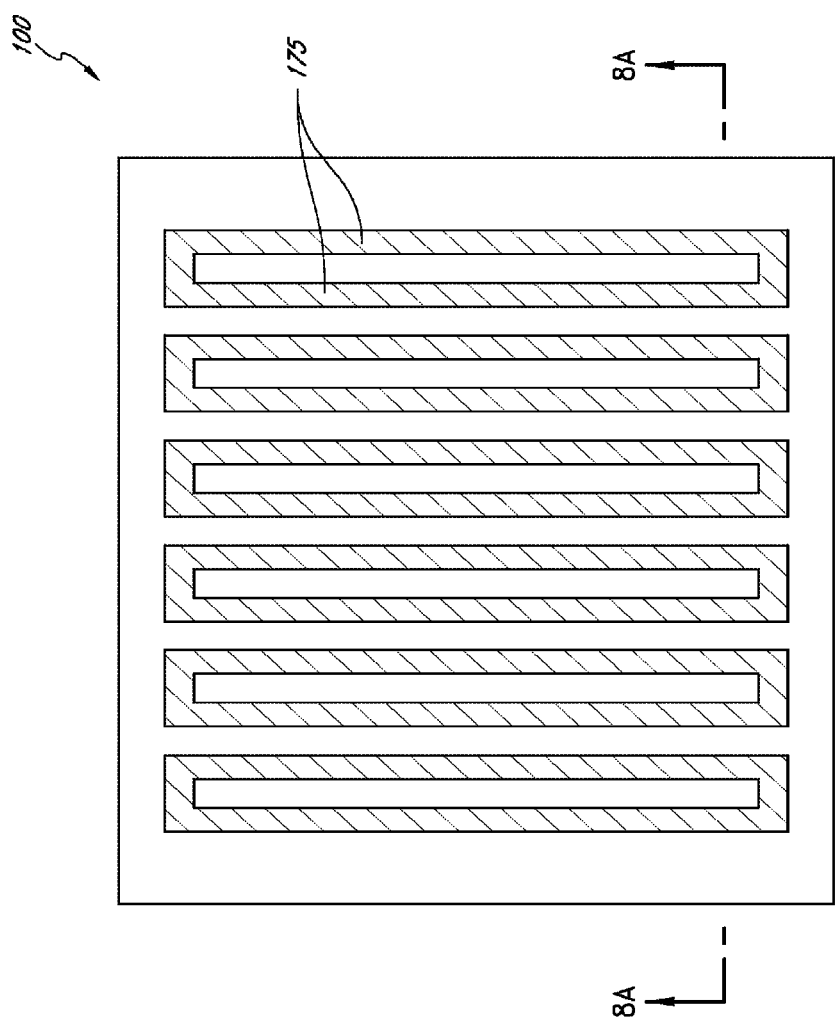

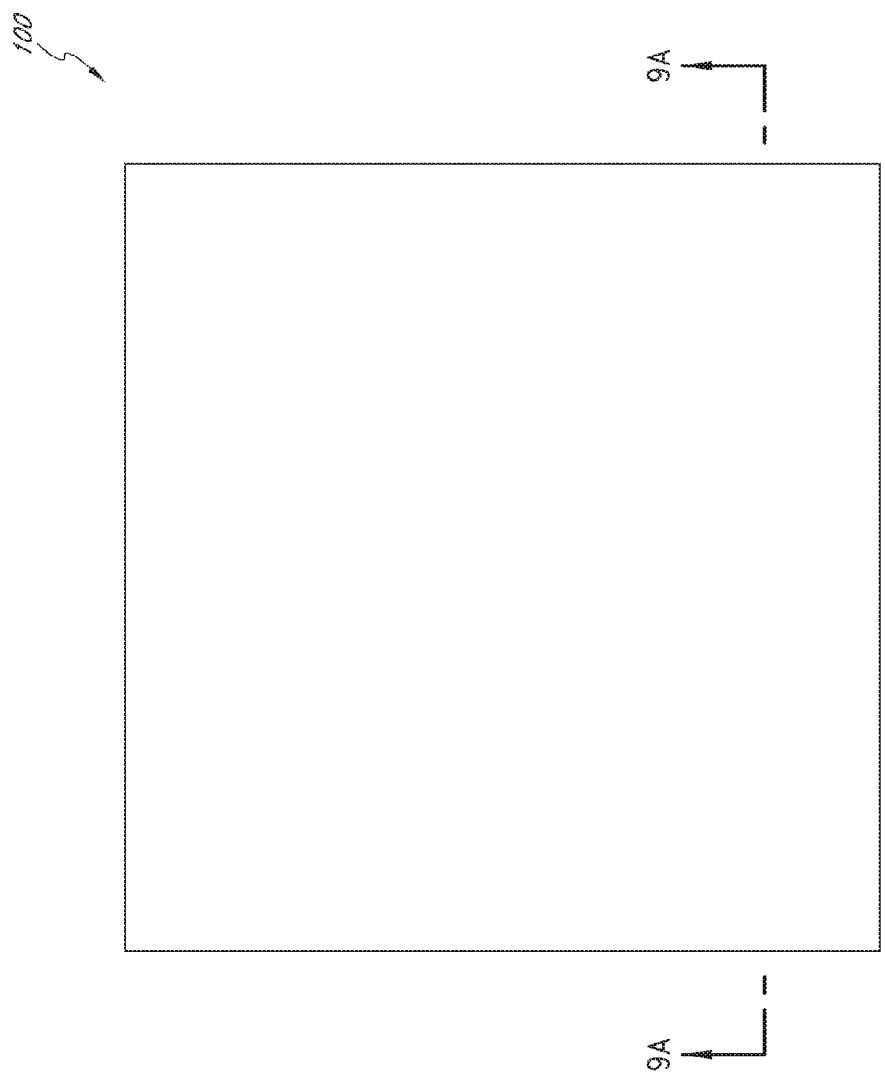

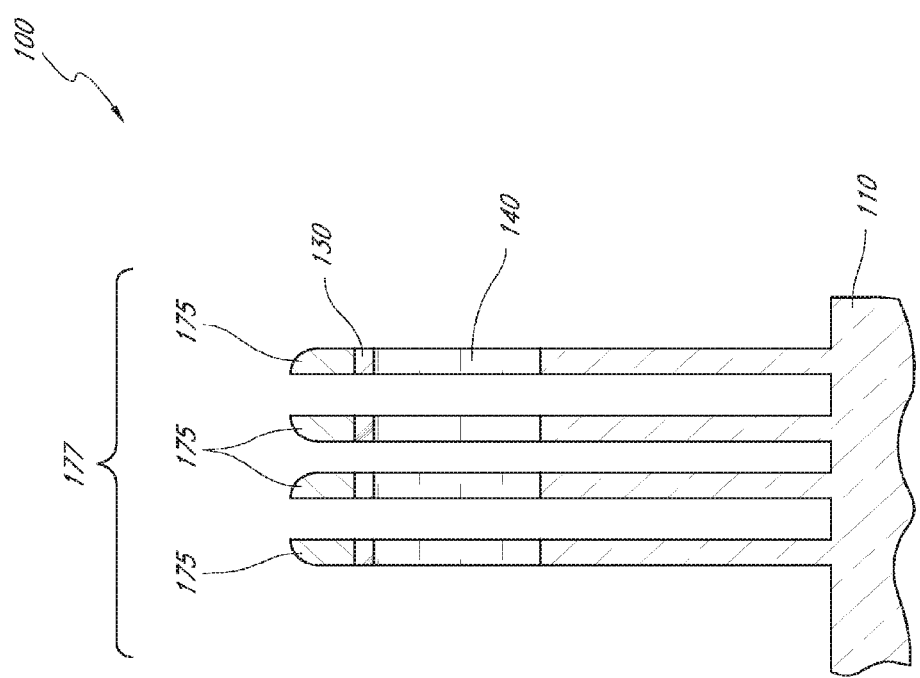

METHODS FOR ISOLATING PORTIONS OF A LOOP OF PITCH-MULTIPLIED MATERIAL AND RELATED STRUCTURES

REFERENCE TO RELATED APPLICATIONS

This patent resulted from a divisional of U.S. patent application Ser. No. 14/592,498 filed Jan. 8, 2015, which is a continuation of U.S. patent application Ser. No. 13/777,803 filed Feb. 26, 2013, now U.S. Pat. No. 8,932,960, which is a divisional U.S. patent application Ser. No. 12/845,167 filed Jul. 28, 2010, now U.S. Pat. No. 8,390,034, which is a divisional of U.S. patent application Ser. No. 11/959,409 filed Dec. 18, 2007, now U.S. Pat. No. 7,790,531, the disclosures of which are incorporated by reference herein, and which are related to and incorporate the following by reference in their entireties: U.S. patent application Ser. No. 10/934,778 to Abatchev et al., filed Sep. 2, 2004, now U.S. Pat. No. 7,115,525; U.S. patent application Ser. No. 10/931,771 to Tran et al., filed Aug. 31, 2004, now U.S. Pat. No. 7,151,040; U.S. patent application Ser. No. 11/216,477 to Tran et al., filed Aug. 31, 2005, now U.S. Pat. No. 7,611,944; and U.S. patent application Ser. No. 11/214,544 to Tran et al., filed Aug. 29, 2005, now U.S. Pat. No. 7,253,118.

BACKGROUND OF THE INVENTION

Field of the Invention

This invention relates generally to the fabrication of integrated circuits and electronic devices and, more particularly, to fabrication methods and related structures.

Description of the Related Art

As a consequence of many factors, including demand for increased portability, computing power, memory capacity and energy efficiency, integrated circuits are constantly being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions or billions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor.

In another example, flash memory typically includes billions of flash memory cells containing floating gate field effect transistors that can retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices.

The concept of pitch may be used to describe one aspect of the sizes of features in an integrated circuit such as a memory device. Pitch is defined as the distance between identical points in two neighboring features, such as features in an array, which are typically arranged in a repeating pattern. These features are typically defined by spaces between adjacent features, which spaces are typically filled by a material, such as an insulator. As a result, pitch may be viewed as the sum of the width of a feature and of the width of the space on one side of the feature separating that feature from a neighboring feature. It will be appreciated that the spaces and features, such as lines, typically repeat to form a repetitive pattern of spacers and features.

Critical dimension (CD) is another term used to describe the sizes of features. The critical dimension is the smallest dimension of a feature in a particular circuit or masking scheme. Controlling the CD of certain structures, such as shallow trench isolation (STI) structures, during integrated circuit fabrication helps to facilitate the continued size reduction of integrated circuits by, e.g., ensuring predictable circuit performance.

The continual reduction in feature sizes places ever greater demands on the techniques used to form the features. For example, photolithography is commonly used to pattern features, such as conductive lines, in integrated circuit fabrication. However, due to factors such as optics, light or radiation wavelength and available photoresist materials, photolithography techniques may each have a minimum pitch or critical dimension below which a particular photolithographic technique cannot reliably form features. Thus, the inherent limitations of photolithographic techniques are obstacles to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern in the photoresist layer is transferred to the layer 20, thereby forming placeholders, or mandrels, 40. The photoresist lines 10 are stripped and the mandrels 40 are etched to increase the distance between neighboring mandrels 40, as shown in FIG. 1C. A layer 50 of spacer material is subsequently deposited over the mandrels 40, as shown in FIG. 1D. Spacers 60 are then formed on the sides of the mandrels 40. The spacer formation is accomplished by preferentially etching the spacer material from the horizontal surfaces 70 and 80, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by the spacers 60.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

While allowing for smaller critical dimensions and pitch, pitch multiplication faces continuing development as new challenges emerge, as the requirements of integrated circuit fabrication change. Accordingly, there is a constant need for methods and structures for forming small features.

BRIEF DESCRIPTION OF THE DRAWINGS

FIG. 2 is a schematic top plan view of a partially formed integrated circuit, in accordance with embodiments of the invention.

FIGS. 8A and 8B are schematic, cross-sectional side and top plan views of the partially formed integrated circuit of FIGS. 7A and 7B after removing a remaining portion of the temporary layer to leave a pattern of spacers in the array region of the integrated circuit, in accordance with embodiments of the invention.

FIGS. 9A and 9B are schematic, cross-sectional side and top plan views of the partially formed integrated circuit of FIGS. 8A and 8B after depositing photoresist between and over the spacers, in accordance with embodiments of the invention.

FIG. 13 is a schematic, cross-sectional side view of the partially formed integrated circuit of FIG. 12 after transferring the combined pattern to the underlying substrate, in accordance with embodiments of the invention.

DETAILED DESCRIPTION OF THE SOME EMBODIMENTS

Figure 1A:
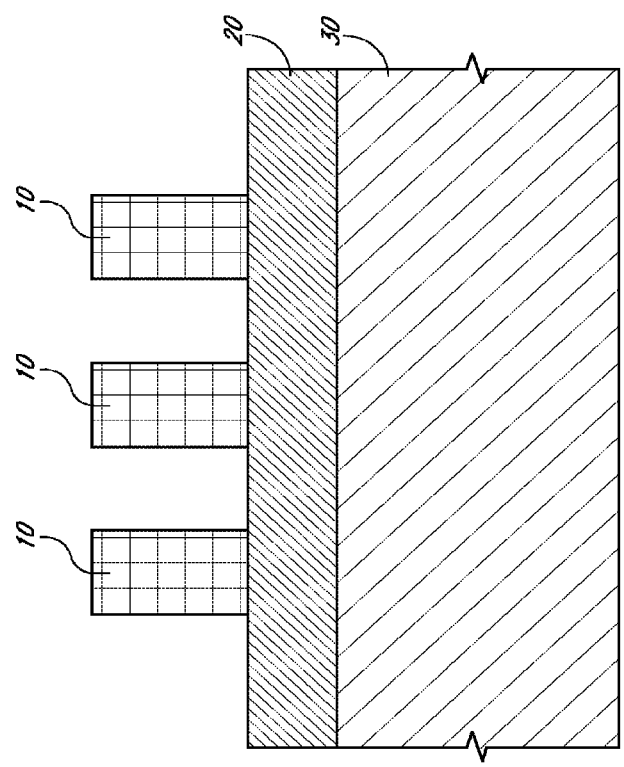
FIGS. 1A-1F are schematic, cross-sectional side views of a sequence of masking patterns for forming conductive lines, in accordance with a prior art pitch doubling method.
Figure 1B:
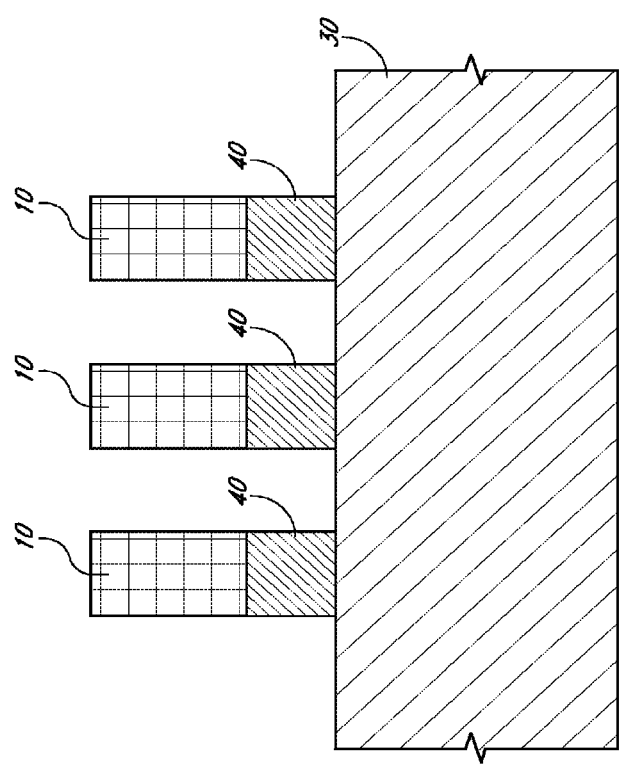
Figure 1C:
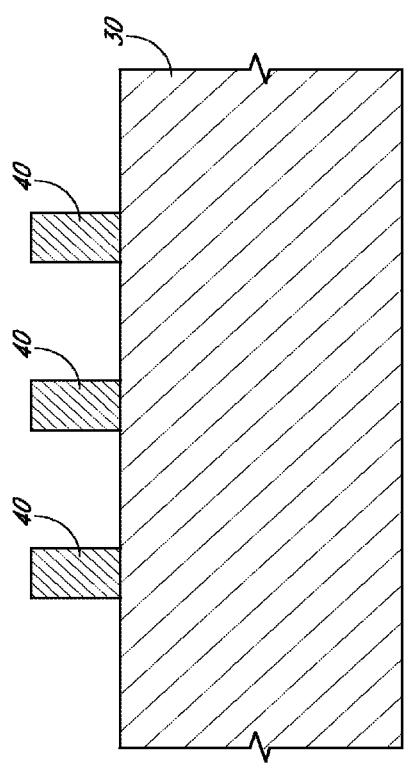
Figure 1D:
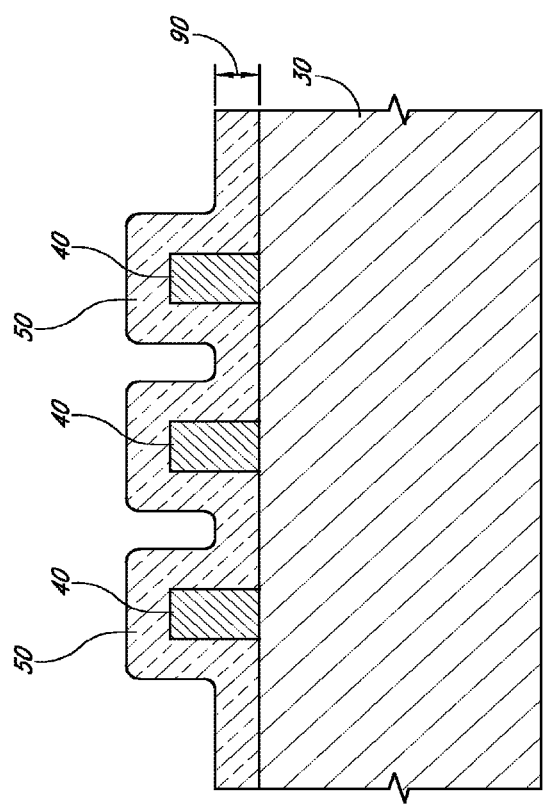
Figure 1E:
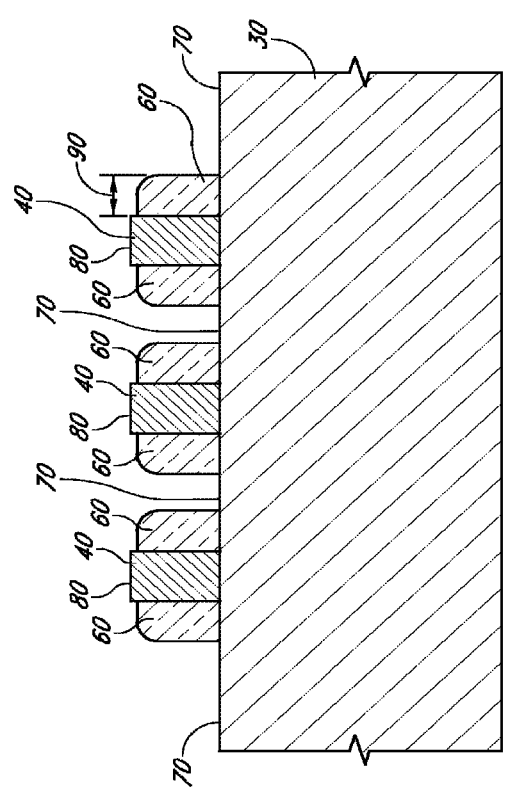
Figure 1F:
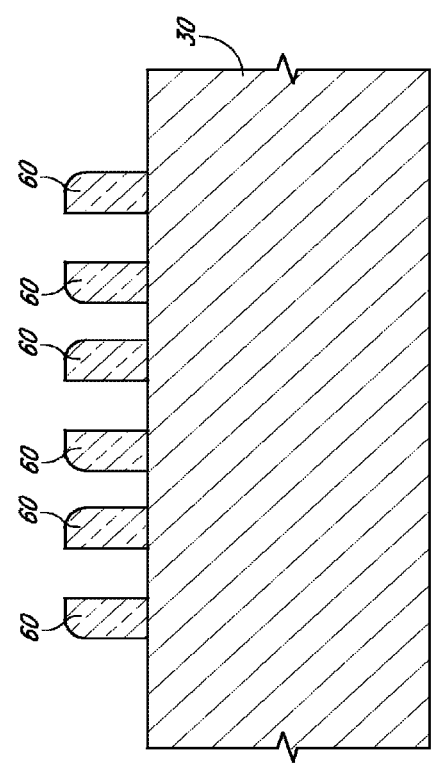

Pitch multiplication has the ability to form closely spaced lines by patterning those lines using a mask formed by spacers. Because the spacers are formed on sidewalls of mandrels, the spacers typically form a continuous loop. Using these continuous loops to pattern a substrate may form continuous loops of material in the substrate. However, separated lines are typically desired for use in various applications, such as bit lines or word lines in a memory device. Thus, to utilize the closely spaced pairs of lines patterned using a spacer loop, the ends of the loops are typically etched to physically, electrically disconnect different legs of the loops from each other. Methods and structures for such an etch (called a loop etch) are described in U.S. Pat. No. 7,151,040, the entire disclosure of which is incorporated by reference herein.

For a loop etch, a protective material is typically deposited around and over the loops. The protective material is then patterned to expose the loop ends. The exposed loops are exposed to an etch and removed. The protective material is subsequently removed, leaving physically separated lines. Thus, loop end etching may involve deposition, patterning and material removal steps. It will be appreciated that the patterning step may involve performing photolithography and exposure of protective material to light through a mask. Due to the time needed to perform these steps and, possibly, the time needed to transport a substrate between processing equipment to perform these steps, the loop etch can undesirably add to the time and complexity involved in, e.g., fabricating an integrated circuit using pitch multiplication.

Advantageously, in accordance with some embodiments of the invention, different legs of a semiconductor loop are electrically isolated without needing to perform a loop etch. Rather, isolation transistors are formed in the loops to electrically isolate the different legs from each other. A gate is formed over the loop of semiconductor material and the regions of the loop neighboring the gate are doped to form source and drain regions. The loop region directly below the gate functions as an active area. The gate is biased in the off state to prevent current flow through the active area, thereby electrically isolating from each other the parts of the loop that lie on either side of the gate. In some embodiments, an isolation transistor is formed at the ends of each leg of the loops, for a total of four such transistors per loop. The isolation transistors define two electrically isolated legs of semiconductor material between each pair of transistors.

In some embodiments, the loops of semiconductor material, e.g., doped semiconductor material, are formed by a pitch multiplication process. Spacer loops are formed on a level over a substrate. A block of masking material is overlaid on a section of each of the loops, e.g., a different block of masking material is overlaid on each end of the loops in embodiments where the loops are substantially parallel lines of material joined together at their ends. The pattern defined by the spacer loops and the blocks of masking material are transferred to a substrate, thereby forming lines of semiconductor material that terminate at and are contiguous with the blocks of the semiconductor material. A transistor gate is formed on each line of semiconductor material and adjacent each block of semiconductor material. The block of semiconductor material and the part of the line on a side of the gate opposite the block are doped to form source/drain regions. The blocks and the gate are electrically tied together and are biased in the off state to electrically isolate the lines of semiconductor material from the blocks. Thus, each line disposed between the blocks is electrically isolated from other lines without needing to perform a loop etch.

Advantageously, it will be appreciated that the steps for forming the isolation transistors are typically already part of a process flow for forming other transistors, e.g., the isolation transistors can be formed using the same patterning, doping and deposition steps used to form floating gate transistors and select gates in a memory device. As a result, in many embodiments, the formation of the isolation transistors do not introduce any additional steps to the process flow. Moreover, by obviating the loop etch, the process steps involved in the loop etch can be omitted. Thus, the process flow is simplified and process throughput is increased.

In addition, in some embodiments, lines may be formed having a pitch below the minimum pitch of the photolithographic method used to pattern the various photoresist layers illustrated herein. Advantageously, embodiments of the invention allow the formation of lines having a pitch of about 100 nm or less or about 50 nm or less.

Reference will now be made to the Figures, wherein like numerals refer to like parts throughout. It will be appreciated that these Figures are not necessarily drawn to scale. Moreover, it will be appreciated that only a limited number of features, including mask features and etched features such as bit lines, word lines, spacers, and memory blocks are illustrated for ease of discussion and illustration. Additional numbers of these features can be provided in some embodiments.

In a first phase of some embodiments of the invention, mask features are formed by pitch multiplication.

FIG. 2 shows a top view of a portion of a partially fabricated integrated circuit 100. While the embodiments of the invention may be used to form any integrated circuit and may be applied to form masks for patterning various substrates, they may particularly advantageously be applied to form devices having arrays of electrical devices, including memory cell arrays for volatile and non-volatile memory devices such as DRAM, ROM or flash memory, including NAND or NOR flash memory, or integrated circuits having logic or gate arrays. For example, the logic array may be a field programmable gate array (FPGA) having a core array similar to a memory array and a periphery with supporting logics. Consequently, the integrated circuit 100 may be, e.g., a memory chip or a processor, which may include both a logic array and embedded memory, or any other integrated circuit having a logic or a gate array.

With continued reference to FIG. 2, a central region 102, the "array," is surrounded by a peripheral region 104, the "periphery." It will be appreciated that, in a fully formed integrated circuit, the array 102 will typically be densely populated with electrically conductive line and electrical devices, including transistors and/or capacitors. In a memory device, the electrical devices form a plurality of memory cells, which may be arranged in a regular grid pattern at the intersection of word lines and bit lines. Desirably, pitch multiplication may be used to form features such as rows/columns of transistors and/or capacitors in the array 102, as discussed herein. On the other hand, the periphery 104 typically comprises features larger than those in the array 102. Conventional photolithography, rather than pitch multiplication, is preferably used to pattern features, such as logic circuitry, in the periphery 104, because the geometric complexity of logic circuits located in the periphery 104 makes using pitch multiplication difficult, whereas the regular grid typical of array patterns is conducive to pitch multiplication. In addition, some devices in the periphery require larger geometries due to electrical constraints, thereby making pitch multiplication less advantageous than conventional photolithography for such devices. In some cases, the periphery 104 may contain patterns/circuits defined by both conventional lithography and pitch multiplication. In addition to possible differences in relative scale, it will be appreciated by the skilled artisan that the relative positions, and the number of periphery 104 and array 102 regions in the partially fabricated integrated circuit 100 may vary from that depicted.

Figure 3A:
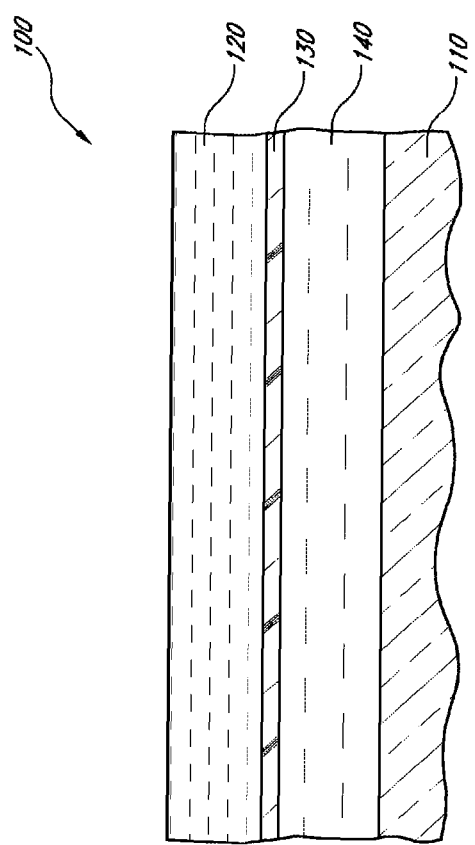
FIGS. 3A and 3B are schematic cross-sectional side and top plan views of the partially formed integrated circuit of FIG. 2, in accordance with embodiments of the invention.

FIG. 3A shows a cross-sectional side view of the partially formed integrated circuit 100. Various masking layers 120-140 are provided above a substrate 110. The layers 120-140 will be etched to form a mask for patterning the substrate 110, as discussed below. In the illustrated embodiment, a selectively definable layer 120 overlies a hard mask, or etch stop, layer 130, which overlies a primary mask layer 140, which overlies the substrate 110 to be processed (e.g., etched) through a mask.

The materials for the layers 120-140 overlying the substrate 110 are chosen based upon consideration of the chemistry and process conditions for the various pattern forming and pattern transferring steps discussed herein. Because the layers between the topmost selectively definable layer 120 and the substrate 110 function to transfer a pattern derived from the selectively definable layer 120 to the substrate 110, the layers 130-140 between the selectively definable layer 120 and the substrate 110 are chosen so that they may be selectively etched relative to other exposed materials. It will be appreciated that a material is considered selectively, or preferentially, etched when the etch rate for that material is at least about 2-3 times greater, at least about 10 times greater, at least about 20 times greater, or at least about 40 times greater than that for surrounding materials. Because a goal of the layers 120-130 overlying the primary hard mask layer 140 is to allow well-defined patterns to be formed in that layer 140, it will be appreciated that one or more of the layers 120-130 may be omitted or substituted if suitable other materials, chemistries and/or process conditions are used. For example, where the substrate is relatively simple and may be selectively etched relative to the hard mask layer 130, the primary hard mask layer 140 may be omitted and patterns may be transferred directly to the substrate using the hard mask layer 130.

With continued reference to FIG. 3A, the selectively definable layer 120 is photodefinable, e.g., formed of a photoresist, including any photoresist, including any positive or negative photoresist, known in the art. For example, the photoresist may be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, may be used to define the selectively definable layer 120. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm wavelength light. KrF photoresists are used with longer wavelength photolithography systems, such as 248 nm systems. In other embodiments, the layer 120 and any subsequent resist layers may be formed of a resist that may be patterned by nano-imprint lithography, e.g., by using a mold or mechanical force to pattern the resist.

Figure 7A:
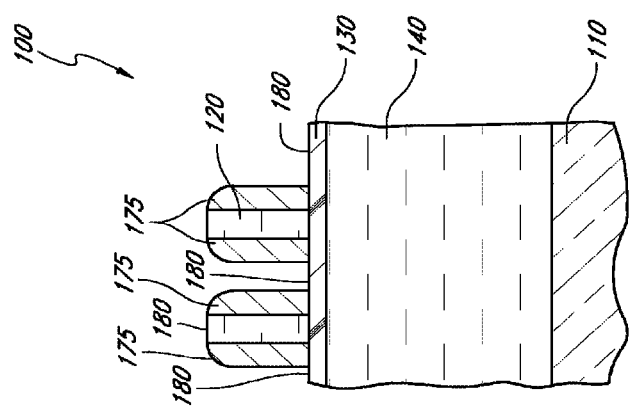
FIGS. 7A and 7B are schematic, cross-sectional side and top plan views of the partially formed integrated circuit of FIG. 6 after a spacer etch, in accordance with embodiments of the invention.

In some embodiments, the material for the hard mask layer 130 comprises an inorganic material. Materials for the hard mask layer 130 include silicon oxide ($SiO_2$), silicon or an anti-reflective coating (ARC), such as a silicon-rich silicon oxynitride, a silicon-rich nitride, or a film that has the desired etch selectivity relative to the spacers 175 or other exposed materials (FIG. 7A). The hard mask layer 130 may also include combinations of layers of materials, e.g., a bottom anti-reflective coating (BARC) over a dielectric anti-reflective coating (DARC). For ease of description, in the illustrated embodiment, the hard mask layer 130 is an anti-reflective coating, such as DARC. It will be appreciated that using ARCs for the hard mask layer 130 may be particularly advantageous for forming patterns having pitches near the resolution limits of a photolithographic technique. The ARCs can enhance resolution by minimizing light reflections, thus increasing the precision with which photolithography can define the edges of a pattern.

With continued reference to FIG. 3A, embodiments of the invention may utilize a primary masking layer to facilitate pattern transfer to a substrate. As noted above, in common methods of transferring patterns, both the mask and the underlying substrate are exposed to etchant, which may wear away a mask before the pattern transfer is complete. These difficulties are exacerbated where the substrate comprises multiple different materials to be etched. Due to its excellent etch selectivity relative to a variety of materials, including oxides, nitrides and silicon, the primary masking layer may be formed of amorphous carbon.

The amorphous carbon layer may be formed by chemical vapor deposition using a hydrocarbon compound, or mixtures of such compounds, as carbon precursors. Carbon precursors may include propylene, propyne, propane, butane, butylene, butadiene and acetelyne. A method for forming amorphous carbon layers is described in U.S. Pat. No. 6,573,030 B1, issued to Fairbairn et al. on Jun. 3, 2003, the entire disclosure of which is incorporated herein by reference. In some embodiments, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference. In addition, the amorphous carbon may be doped. A suitable method for forming doped amorphous carbon is described in U.S. patent application Ser. No. 10/652,174 to Yin et al., the entire disclosure of which is incorporated herein by reference.

It will be appreciated that the "substrate" to which patterns are transferred may include a layer of a single material, a plurality of layers of different materials, a layer or layers having regions of different materials or structures in them, etc. These materials may include semiconductors, insulators, conductors, or combinations thereof. In the illustrated embodiment, the substrate is formed of doped semiconductor material, e.g., semiconductor material containing p-type dopant.

Figure 4A:
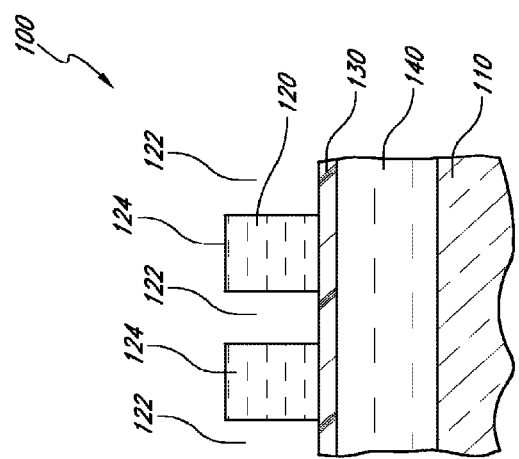
FIGS. 4A and 4B are schematic cross-sectional side and top plan views of the partially formed integrated circuit of FIGS. 3A and 3B after forming lines in a photoresist layer in an array region of the integrated circuit, in accordance with embodiments of the invention.
Figure 4B:
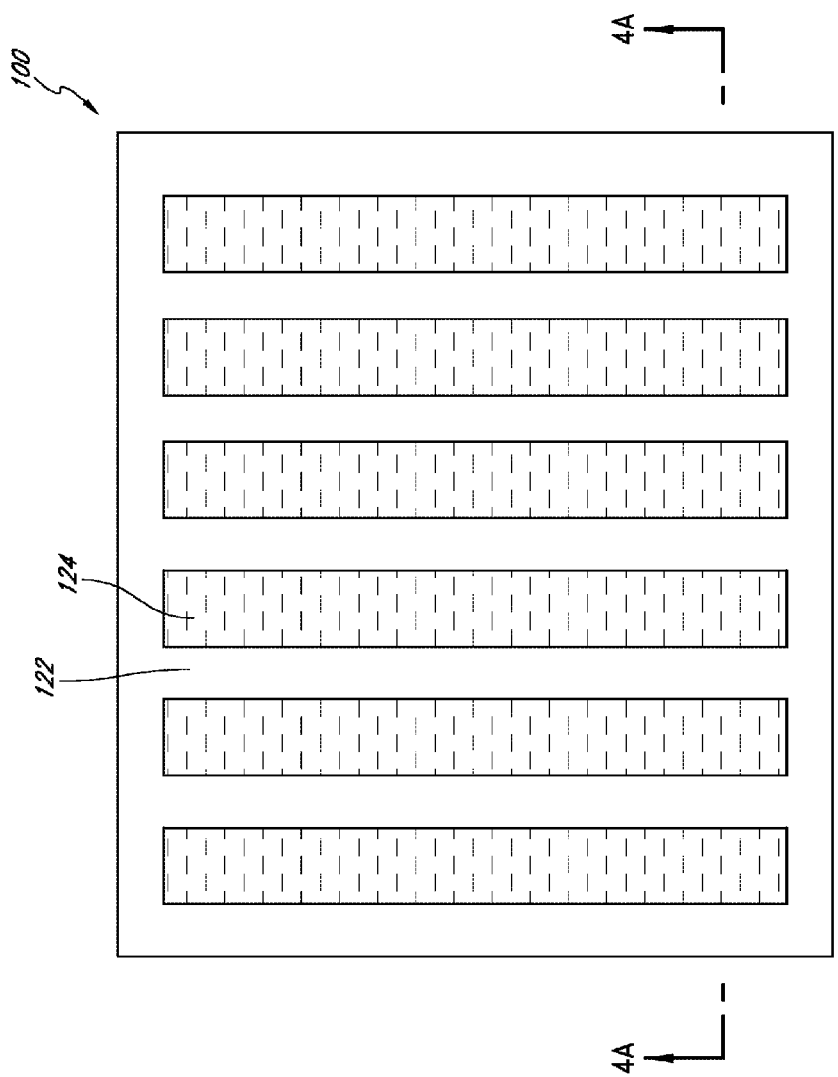

With reference to FIGS. 4A and 4B, a pattern comprising spaces or trenches 122, which are delimited by photodefinable material features 124, is formed in the photodefinable layer 120. The trenches 122 may be formed by, e.g., photolithography with 248 nm or 193 nm light, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch may be at or near the limits of the photolithographic technique used to pattern the photodefinable layer 120. For example, for photolithography utilizing 248 nm light, the pitch of the lines 124 may be about 100 nm. Thus, the pitch may be at the minimum pitch of the photolithographic technique and the spacer pattern discussed below may advantageously have a pitch below the minimum pitch of the photolithographic technique. Alternatively, because the margin of error for position and feature size typically increases as the limits of a photolithographic technique are approached, the lines 124 may be formed having larger feature sizes, e.g., 200 nm or more, to minimize errors in the position and sizes of the lines 124.

Figure 5A:
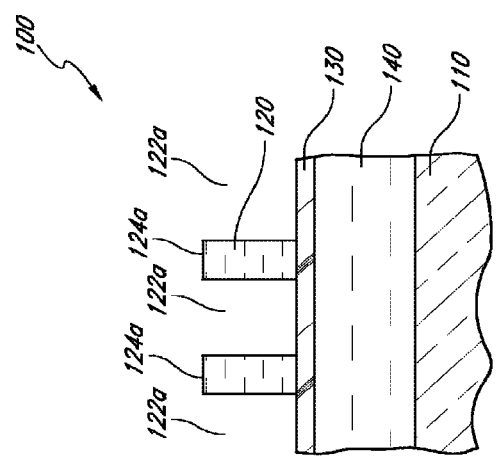
FIGS. 5A and 5B are schematic cross-sectional side and top plan views of the partially formed integrated circuit of FIGS. 4A and 4B after widening spaces between lines in the photoresist layer, in accordance with embodiments of the invention.
Figure 5B:
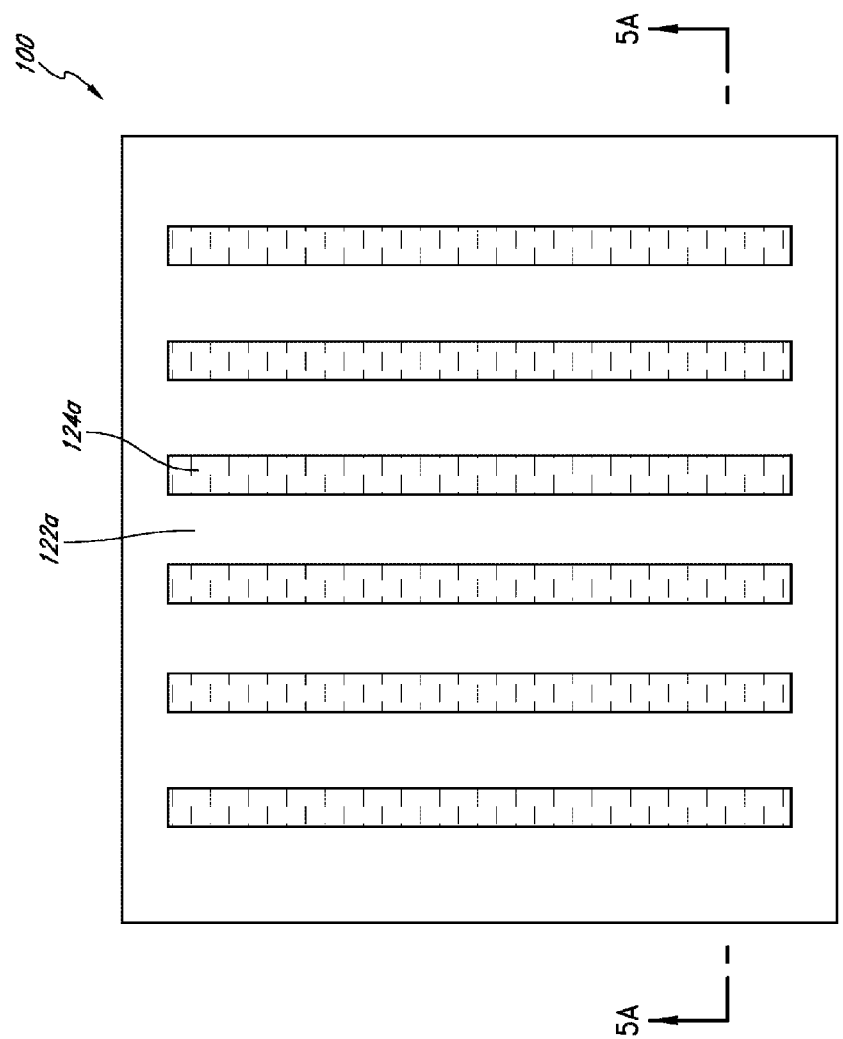

As shown in FIGS. 5A and 5B, the spaces 122 are widened by etching the photoresist lines 124, to form modified spaces 122a and lines 124a. The photoresist lines 124 are etched using an isotropic etch to "shrink" or trim those features. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The extent of the etch is selected so that the widths of the lines 124a are substantially equal to the desired spacing between the later-formed spacers 175 (FIG. 7), as will be appreciated from the discussion below. For example, the width of the lines 124 may be reduced from about 80-120 nm to about 30-70 nm or about 50-70 nm. Advantageously, the width-reducing etch allows the lines 124a to be narrower than would otherwise be possible using the photolithographic technique used to pattern the photodefinable layer 120. While the critical dimensions of the lines 124a may be etched below the resolution limits of the photolithographic technique, it will be appreciated that this etch does not alter the pitch of the spaces 122a and lines 124a, since the distance between identical points in these features remains the same.

Figure 6:
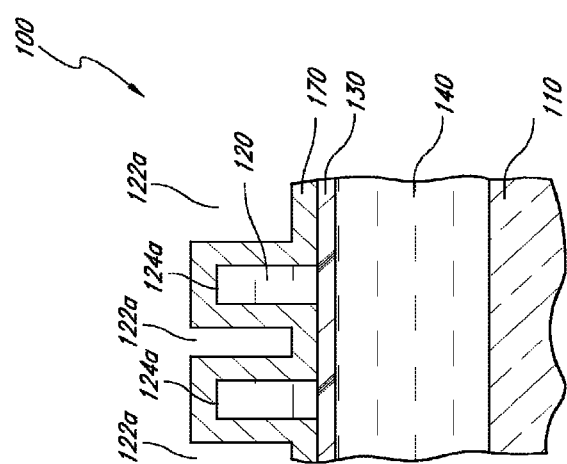
FIG. 6 is a schematic, cross-sectional side view of the partially formed integrated circuit of FIGS. 5A and 5B after depositing a layer of a spacer material, in accordance with embodiments of the invention.

Next, with reference to FIG. 6, a layer 170 of spacer material is blanket deposited conformally over exposed surfaces, including the hard mask layer 150 and the top and sidewalls of the temporary layer 140. The spacer material may be any material that can act as a mask for transferring a pattern to the underlying hard mask layer 130. The spacer material may be, without limitation, silicon, silicon oxide and silicon nitride. In the illustrated embodiment, the spacer material is silicon oxide, which provides particular advantages in combination with other selected materials of the masking stack.

Methods for spacer material deposition include atomic layer deposition, e.g., using a self-limiting deposition with a silicon precursor and a subsequent exposure to an oxygen or nitrogen precursor to form silicon oxides and nitrides, respectively. In some embodiments, to form silicon oxide, a silicon halide, such as silicon hexachlorodisilane (HCD), is introduced in alternating pulses with an oxygen precursor, such as $H_2O$. ALD can be performed at relatively low temperatures, e.g., under about 200° C. or under about 100° C., which has advantages for preventing thermal damage to underlying carbon-based materials, such as photoresist and amorphous carbon layers. In other embodiments, chemical vapor deposition is used to deposit the spacer material, e.g., using $O_3$ and TEOS to form silicon oxide.

The thickness of the layer 170 is determined based upon the desired width of the spacers 175 (FIG. 7A). For example, in some embodiments, the layer 170 is deposited to a thickness of about 20-80 nm or about 40-60 nm to form spacers of roughly similar widths. The step coverage is about 80% or greater and or about 90% or greater.

Figure 7B:
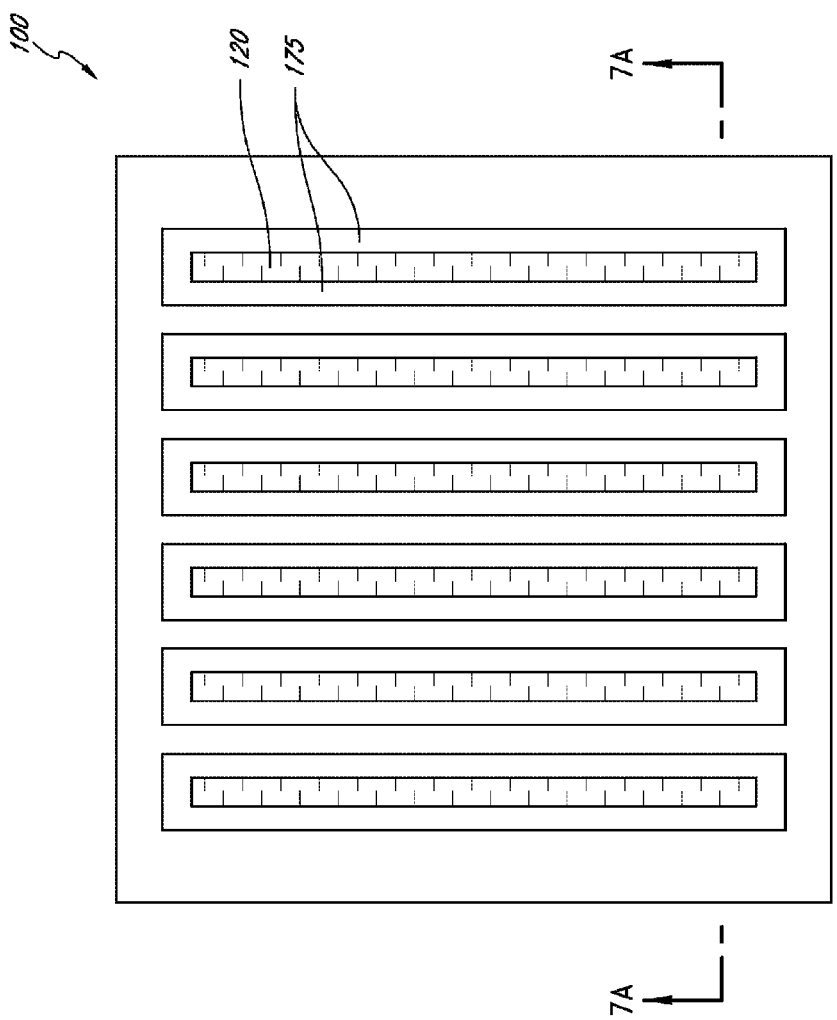

With reference to FIGS. 7A and 7B, the silicon oxide spacer layer 170 is subjected to an anisotropic etch to remove spacer material from horizontal surfaces 180 of the partially formed integrated circuit 100.

Figure 8A:
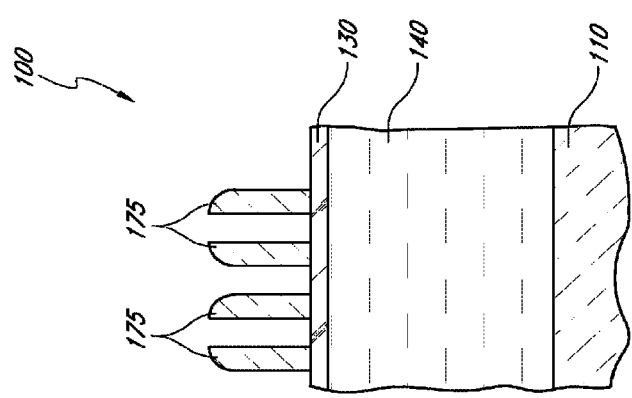

With reference to FIGS. 8A and 8B, the selectively definable layer 120 is next removed to leave freestanding spacers 175. The selectively definable layer 120 may be selectively removed using an, organic strip process.

Thus, pitch-multiplied mask features have been formed. In the illustrated embodiment, the spacers 175 form elongated loops and have substantially parallel legs which are joined at their ends. The pitch of the spacers 175 is roughly half that of the photoresist lines 124 and spaces 122 (FIGS. 4A and 4B) originally formed by photolithography. Where the photoresist lines 124 had a pitch of about 200 nm, spacers 175 having a pitch of about 100 nm or less may be formed. It will be appreciated that because the spacers 175 are formed on the sidewalls of the features or lines 124*b*, the spacers 175 generally follow the outline of the pattern of features or lines 124*a* in the modified photodefinable layer 120*a* and, so, form a closed loop in the spaces 122*a* between the lines 124*a*.

Next, in a second phase of methods according to some embodiments of the invention, blocks of mask material are overlaid the spacers 175 and the resulting pattern is transferred to the substrate 110.

Figure 9A:
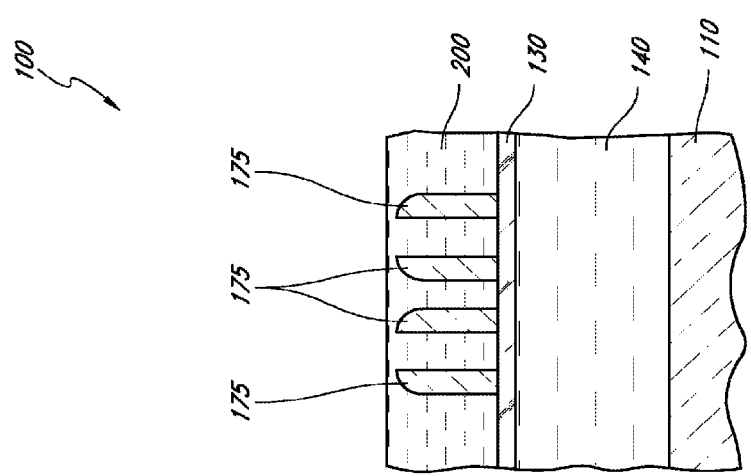

With reference to FIGS. 9A and 9B, a layer 200 of mask material, e.g., photoresist, is deposited between and over the spacers 175. The photoresist layer 200 can be formed of positive or negative photoresist.

Figure 10A:
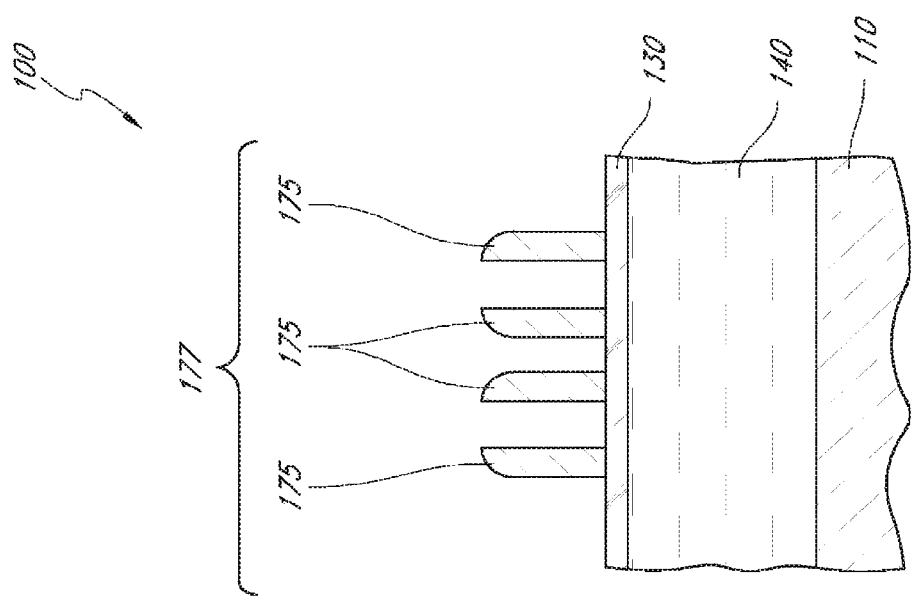
FIGS. 10A and 10B are schematic, cross-sectional side and top plan views of the partially formed integrated circuit of FIGS. 9A and 9B after forming a pattern in the photoresist, in accordance with embodiments of the invention.
Figure 10B:
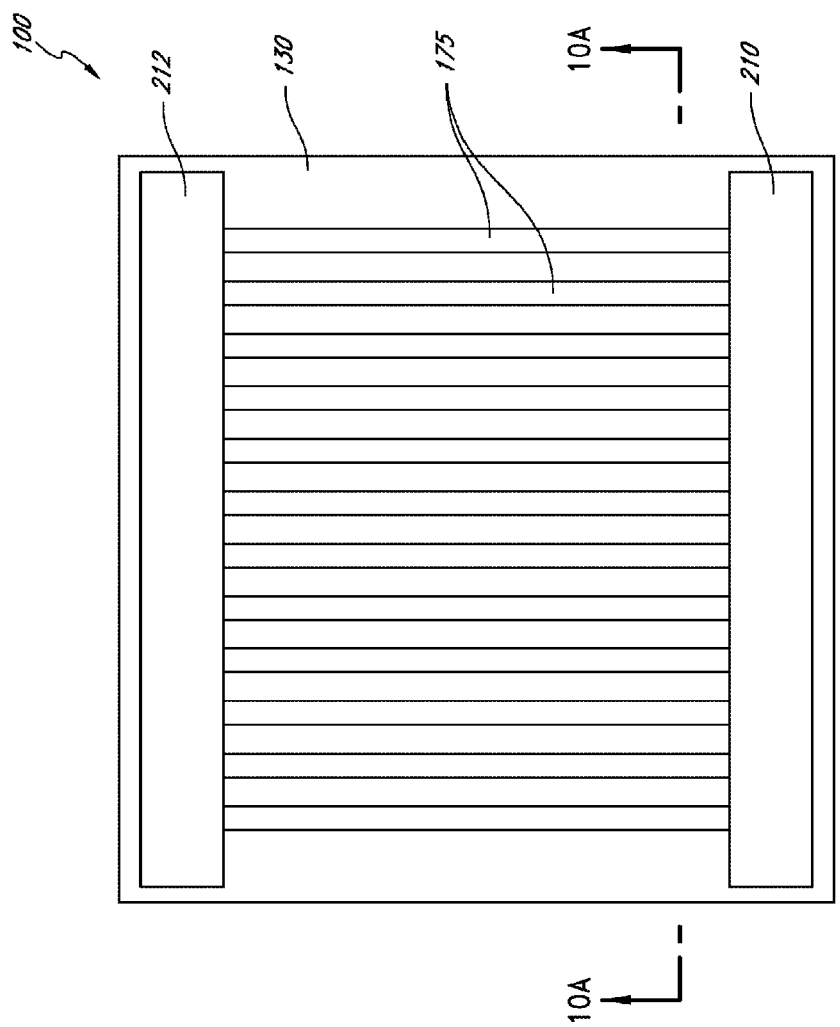

With reference to FIGS. 10A and 10B, the photodefinable layer 200 is patterned by photolithography to form masking material blocks 210, 212 at the ends of the loops of spacers 175. The blocks 210, 212 extend across and contact opposite ends of the spacers 175. Advantageously, the blocks 210, 212 have dimensions sufficiently large to be patterned with photolithography and without performing pitch multiplication. Thus, a mixed pattern 177 formed of pitch multiplied and non-pitch multiplied mask features can be formed. The blocks 210, 212 may be patterned simultaneously with other relatively large features formed in the periphery region of the partially fabricated integrated circuit 100. Methods for combining pitch multiplied and non-pitch multiplied features are disclosed in U.S. Pat. Nos. 7,115,525 and 7,253,118 and U.S. patent application Ser. No. 11/831,012, filed Jul. 31, 2007 by Luan C. Tran. The entire disclosure of each of these references is incorporated herein by reference.

Figure 11:
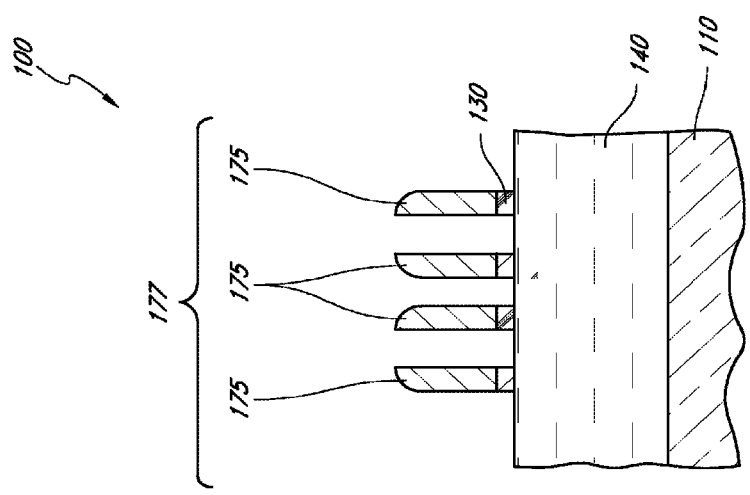
FIG. 11 is a schematic, cross-sectional side view of the partially formed integrated circuit of FIGS. 10A and 10B after transferring a combined pattern defined by the patterned photoresist and the spacers to an underlying hard mask layer, in accordance with embodiments of the invention.

With reference to FIG. 11, the pattern 177 defined by the blocks 210, 212 and the spacers 175 is transferred to the hard mask layer 130. The pattern transfer may be accomplished by, e.g., anisotropically etching the hard mask layer 130.

Figure 12:
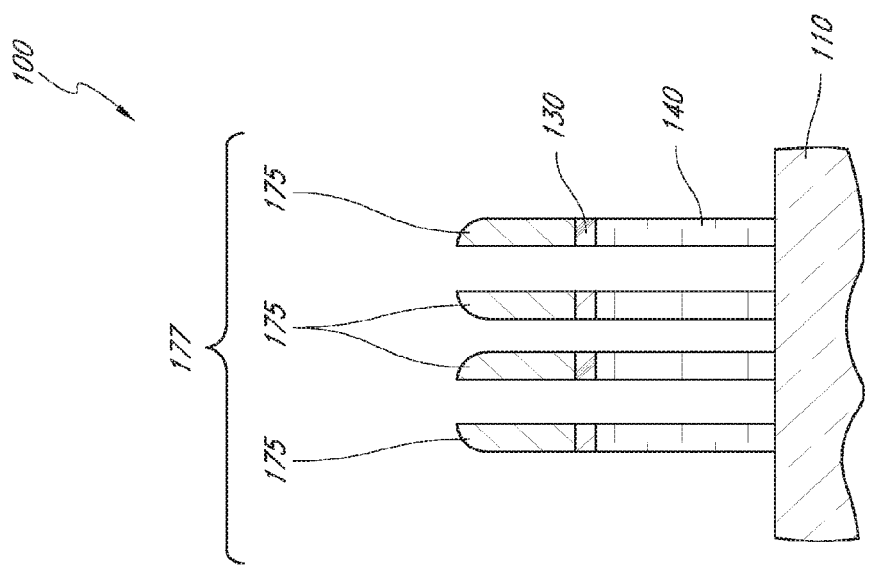
FIG. 12 is a schematic, cross-sectional side view of the partially formed integrated circuit of FIG. 11 after transferring the combined pattern to a primary mask layer, in accordance with embodiments of the invention.

With reference to FIG. 12, the pattern 177 is transferred to the primary mask layer 140. The pattern transfer may be accomplished by, e.g., anisotropically etching the primary mask layer 140. With reference to FIG. 13, the pattern 177 is transferred to the substrate 110 using an anisotropic etch with the layer 140 acting as a mask for the etch.

Figure 14A:
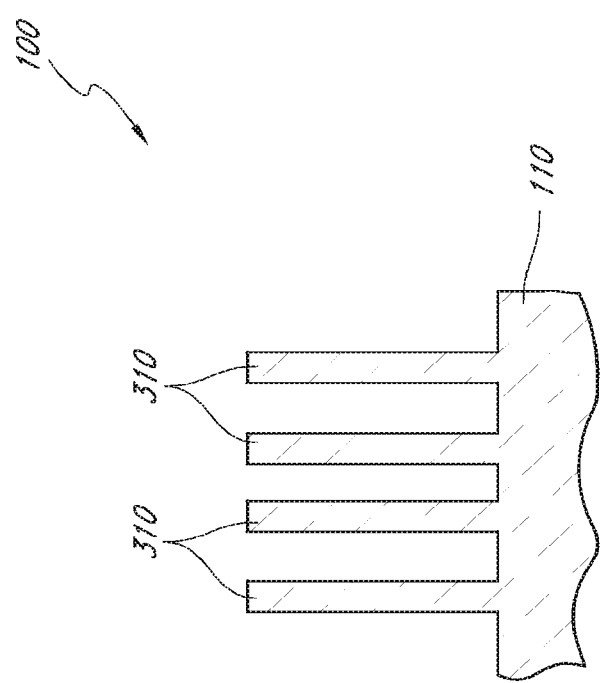
FIGS. 14A and 14B are schematic, cross-sectional side and top views of the partially formed integrated circuit of FIG. 13 after transferring the pattern into the substrate and removing hard mask layers overlying the substrate, in accordance with embodiments of the invention.
Figure 14B:
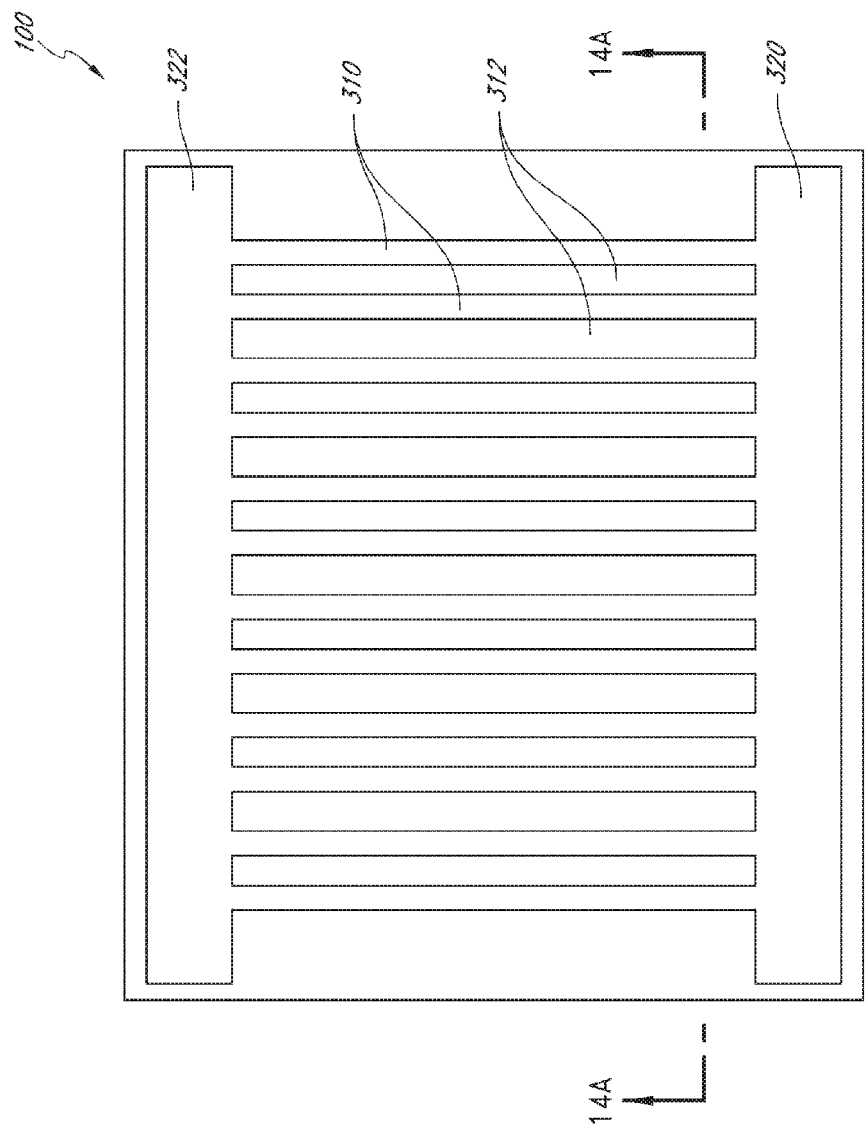

With reference to FIGS. 14A and 14B, the spacers 175 and mask layers 130 and 140 overlying the substrate 110 are removed. Pitch multiplied lines 310 are formed in the substrate 110. At each of their ends, the lines 310 contact laterally separated blocks 320, 322.

Figure 15:
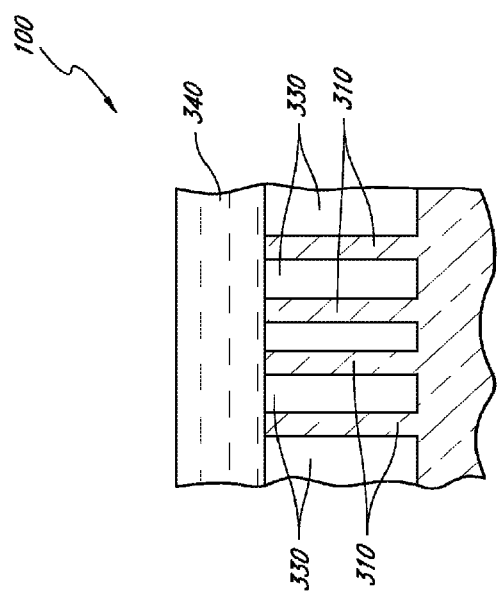
FIG. 15 is a schematic, cross-sectional side view of the partially formed integrated circuit of FIGS. 14A and 14B after filling trenches with a dielectric and forming a sequence of layers corresponding to a gate stack, in accordance with embodiments of the invention.

With reference to FIG. 15, trenches defined by the lines 310 and blocks 320, 322 are filled with insulating material 330, e.g., silicon oxide, for shall trench isolation applications. Memory cell active areas, such as for flash memory, may be defined between the trenches and floating and control gates may be formed over the active areas.

As part of the formation of the floating and control gates, a stack of layers 340 for forming the floating and control gates is subsequently formed over the lines 310, insulating material 330 and blocks 320, 322 (FIG. 14B). It will be appreciated that the composition of the layers 340 can vary across the partially fabricated integrated circuit 100. For example, in some areas, where, e.g., both floating and control gates are desired, the layers 340 can include layers appropriate for the formation of these gates. In other areas, where, e.g., only a select gate is desired, the layers 340 can include fewer layers, as appropriate for formation of the select gate. For example, for forming the select gate, the layers 340 may include a silicide layer over a polysilicon layer, which overlies an oxide-nitride-oxide (ONO) composite layer, which overlies a polysilicon layer.

Figure 16A:
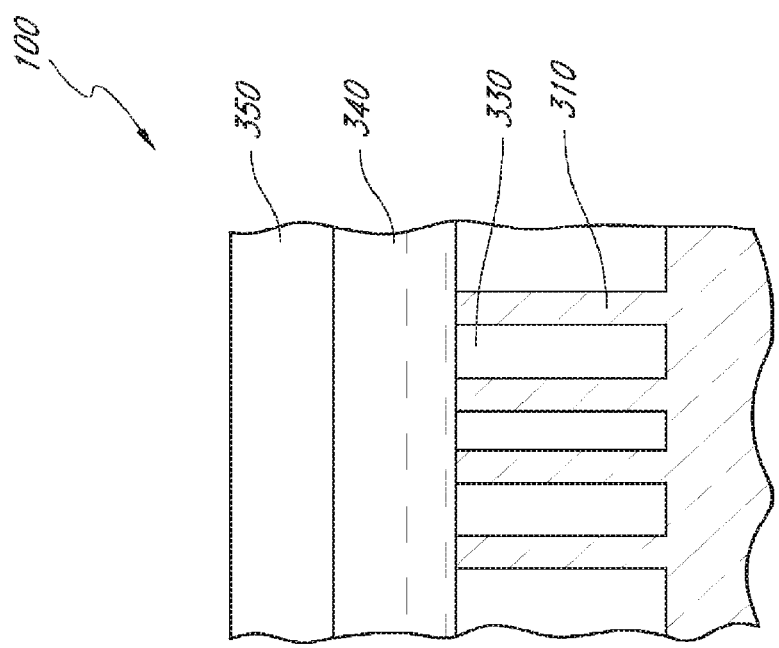
FIGS. 16A, 16B and 16C are schematic, cross-sectional side and top plan views of the partially formed integrated circuit of FIG. 15 after depositing and patterning a photoresist layer, in accordance with embodiments of the invention.
Figure 16B:
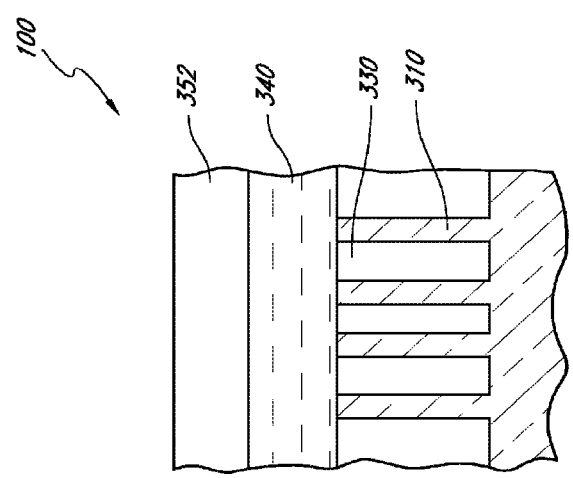
Figure 16C:
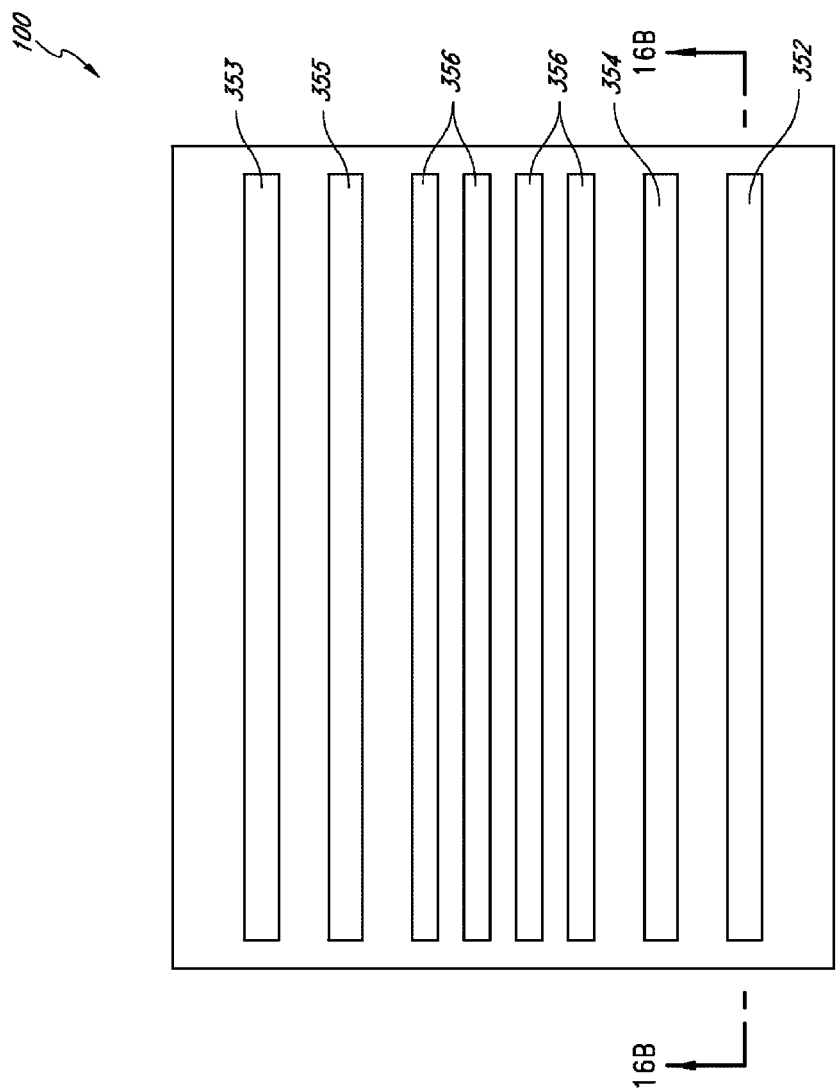

With reference to FIG. 16A, a mask layer 350 is formed over the stack of layers 340. The mask layer 350 may be a selectively definable layer 350 formed of, e.g., photoresist. With reference to FIGS. 16B and 16C, the layer 350 is subsequently patterned, thereby forming elongated strips 352-356. The patterned elongated strips 352-356 may be used to form various features in a memory device. For example, the strips 352-355 may be used to form select gates for regulating reading and writing to memory cells formed along the lines 310, which form active areas. The strips 356 may be used to define word lines and floating and control gates.

Figure 3B:
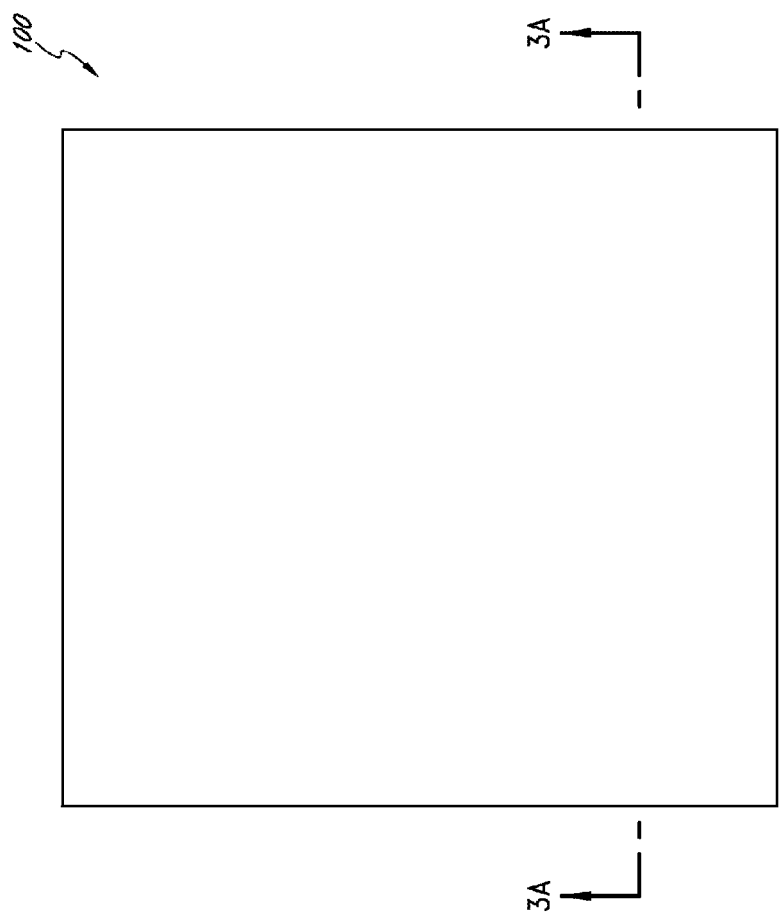

It will be appreciated that the strips 352-356 may be formed in a single step, e.g., by photolithography, or in multiple separate steps. For example, to increase density, the strips 356 may be formed by pitch multiplication. As such, a stack of masking layers as described herein with reference to FIGS. 3A and 3B can be formed over the layers 340. The stack of masking layers may then be processing as discussed herein with reference to FIGS. 3A-8B. The resulting spacer loops may then be subjected to a loop etch, thereby forming the strips 356. The mask layer 350 (FIG. 16A) may subsequently be deposited between and over the spacers 175. The mask layer 350 is then patterned, e.g., by photolithography where the mask layer 350 is formed of photoresist, thereby forming the strips 352-355 (FIGS. 16B and 16C). While not illustrated for ease of discussion, as discussed herein, one or more additional masking layers may be provided between the mask layer 350 to facilitate pattern transfer to the layers 340. For example, an ARC layer may be provided directly beneath the mask layer 350 and an amorphous carbon layer may be provided between the ARC layer and the layer 340. Such a sequence of layers would provide the advantages and could be utilized as noted above for the layers 130 and 140 (FIGS. 3A-13).

Figure 17A:
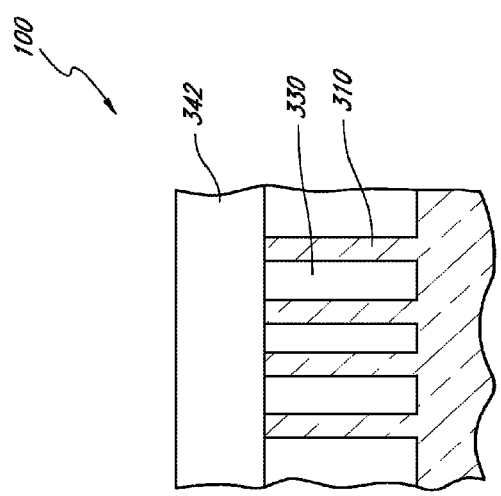
FIGS. 17A and 17B are schematic, cross-sectional side and top plan views of the partially formed integrated circuit of FIGS. 16A and 16B after transferring the pattern from the photoresist layer to the sequence of gate stack layers, in accordance with embodiments of the invention.
Figure 17B:
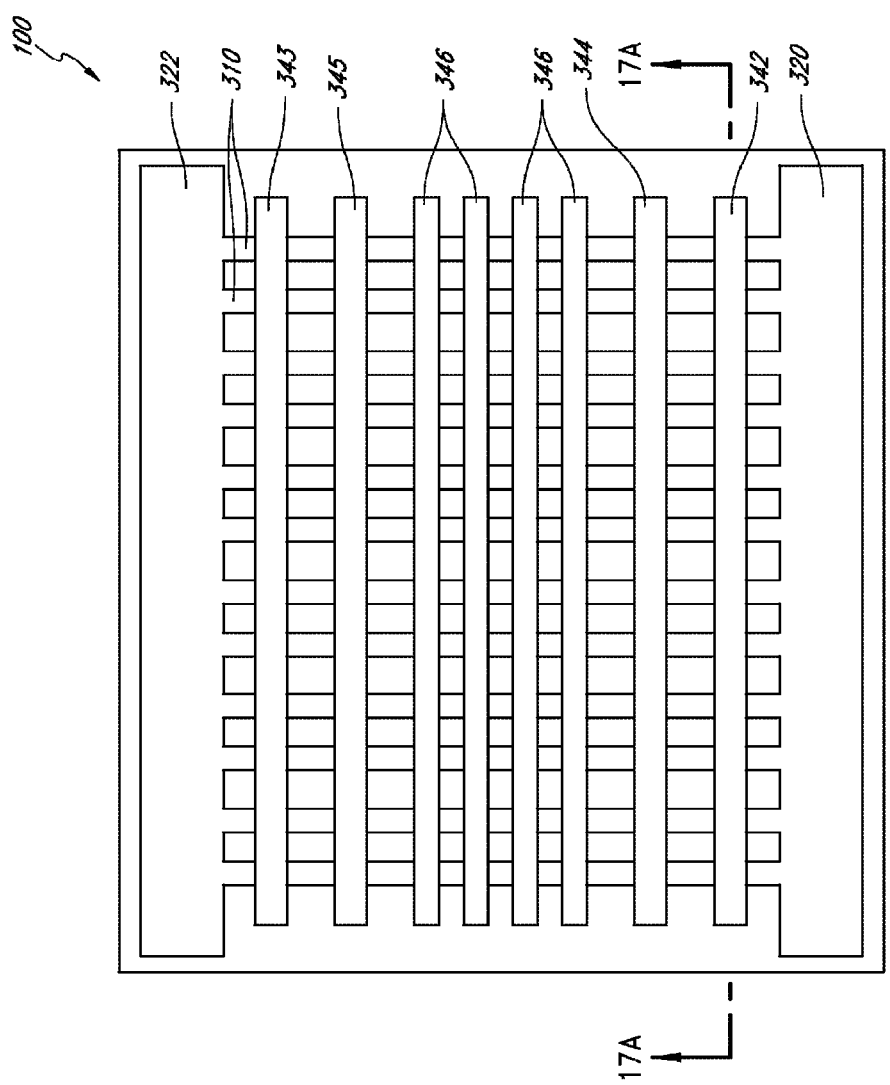

With reference to FIGS. 17A and 17B, the pattern in the mask layer 350 is then transferred to the layers 340, thereby forming strips 342-346 in those layers. The strips 342-346 may correspond to word lines, floating gates, control gates and select gates in those layers.

It will be appreciated that the exposed parts of the lines 310 and blocks 320, 322 of semiconductor material are doped (e.g., with an n-type dopant) to form source/drain regions in the lines 310 and blocks 320, 322 on either side of the strips 342-346. In some embodiments, the feature 320 forms a source and the feature 342 form a gate of isolation transistors for each of the lines 310. Similarly, on an opposite end of the lines 310, the feature 322 forms a source and the feature 343 form a gate of additional isolation transistors for each of the lines 310.

In subsequent processing steps, contacts are made to the various bit and word lines and the bit and word lines are connected to various ancillary circuitry to form a memory device. In some embodiments, the contacts may be made from a level above the bit and word lines. In addition, contacts to the source regions 320, 322 can be electrically connected to the gates 342, 343, respectively, so that the gates and sources of the isolation transistors are tied together for simplicity of operation and reliability, as discussed herein.

Figure 18:
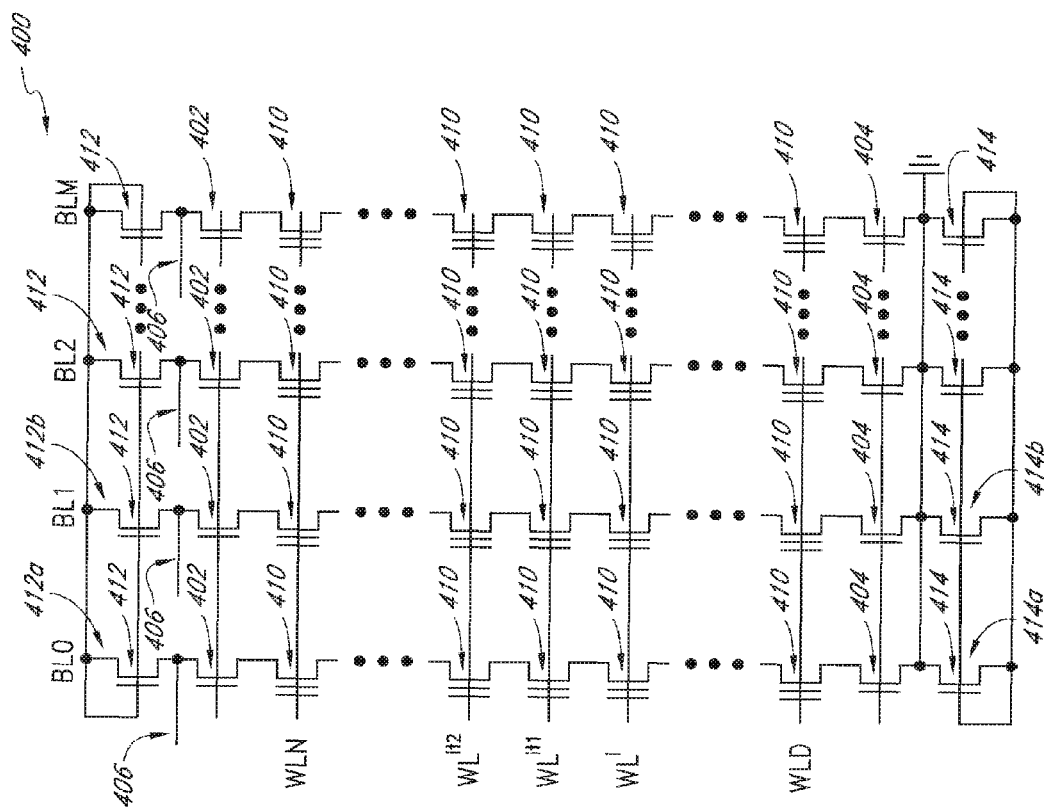
FIG. 18 is a schematic diagram of a memory cell array of a NAND flash memory device, in accordance with embodiments of the invention.

FIG. 18 illustrates a block of a NAND flash memory array in a memory device 400 according to some embodiments of the invention. The illustrated flash memory array includes bit lines BL0 to BLM and word lines WL0 to WLN. The bit lines BL0-BLM extend parallel to one another in a column direction. The word lines WL0-WLN extend parallel to one another in a row direction. The NAND flash memory array also includes select transistors 402, 404 used for selecting a bit line. Ancillary logic and other circuitry (not shown) connect to the bit lines using the bit line contacts 406. The gates of the rows of select transistors 402, 404 correspond to the features 344, 345 (FIG. 17B).

Each bit line includes a string of floating gate transistors coupled in series, source to drain. For example, the second bit line BL1 includes floating gate transistors 110 connected in series. The control gates of floating gate transistors 110 of cells in the same row are coupled to the same word line. Each of the floating gate transistors 110 forms a memory cell that stores a charge (or a lack of charge), wherein the amount of stored charge can be used to represent, for example, one or more states, and wherein the one or more states can represent one or more digits (e.g., bits) of data. The bit is read by detecting the absence or presence of charge.

With continued reference to FIG. 18, bit lines BL0 to BLM are shunted together at their ends. Isolation, or select, transistors 412, 414 electrically isolate individual bit lines from each other by preventing current flow to the shunted ends of the bit lines. The shunted ends correspond to the blocks 320 and 322 (FIG. 17B) and the gates of the select transistors 412, 414 correspond to the features 342, 343 (FIG. 17B).

It will be appreciated that each pair of bit lines, which can also be viewed as a loop of semiconductor material, may include a total of four isolation transistors. For example, isolation transistors 412a and 412b constitute first and second isolation transistors proximate one end of the loop and isolation transistors 414a and 414b constitute third and fourth isolation transistors proximate an opposite end of the loop. Thus, a pair of isolation transistors may be utilized to electrically isolate a single bit line, which are formed by substantially parallel, horizontally elongated portions of the loops. The isolation transistors isolate the expanse of one of these elongated portions from an expanse of another of these elongated portions.

As illustrated in FIG. 18, the source/drain regions of the select transistors 412, 414 are electrically tied or connected to the gates of these transistors and are biased in an off state. During read and write cycles, the gates and tied source/drains can be left floating or connected to ground (0V), thereby electrically isolating all bit lines connected to the isolation transistors 412, 414. During erase operations, the transistors 412, 414 may be in an "on" state. However, because all memory cells are erased simultaneously, the state of the transistors 412, 414 is irrelevant; there is no need to isolate individual bit lines, since the same operation is performed on all cells of the NAND flash memory block.

Figure 19:
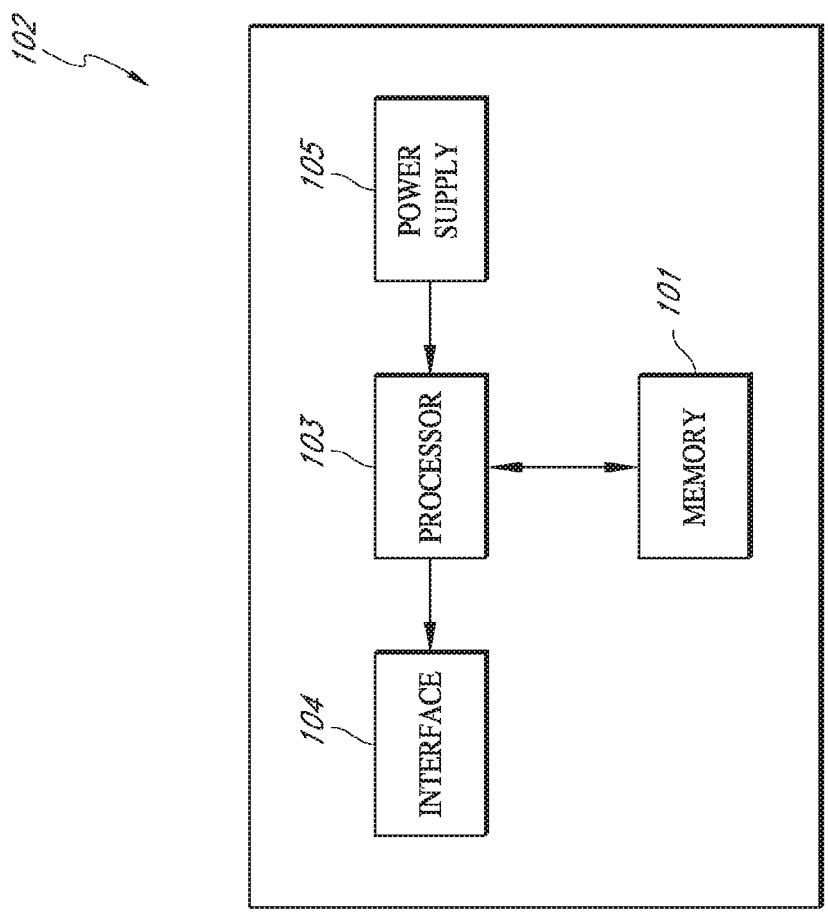
FIG. 19 is a system block diagram illustrating an electronic device including a memory device, in accordance with embodiments of the invention.

As noted above, with reference to FIG. 19, a fully formed integrated circuit 101 formed from the partially fabricated integrated circuit 100 can be incorporated into various systems or devices. For example, the integrated circuit 101 can be utilized as memory for storing data in an electronic device 102 having a computer processor 103, a user interface 104 and power source 105. Examples of such electronic devices include computerized devices, including any device utilizing a memory circuit, such as data storage and retrieval devices, including music, photo and/or video devices.

It will be appreciated that various modifications of the illustrated embodiments are possible. For example, while illustrated with blocks of material for shunting together loops of material, the blocks can be omitted in some embodiments. In those embodiments, contact to individual loop ends are made.

However, the blocks are advantageously for simplifying operation of the isolation transistors and for improving process results. By tying all the loops together, individual access to the loops is obviated, thereby simplifying fabrication and operation of the isolation transistors. Moreover, the blocks can improve process results by facilitating deposition of dielectric into the trenches 312 (FIG. 14B). It has been found that the ends of pitch multiplied loops can be relatively thin relative to mid-portions of the loops. It has also been found that deposition of dielectric into these relatively thin ends can be difficult and prone to void formation. By eliminating these ends by overlying the ends with blocks of masking material, it has been found that filling of the trenches can be improved, leading to integrated circuits with improved reliability.

In some embodiments, the isolation transistors can be omitted from one end of the loops of material. For example, where the material is shunted together for another reason, e.g., where the lines forming the loop are all tied to ground at one end, it may be unnecessary to form an isolation transistor to electrically isolate the lines on the end that is tied to ground. However, as noted above, the formation of block of material at the ends of the loops has benefits for improving filling of trenches defined by the lines. As a result, it may be desirable to form the blocks at both loop ends, even where electrical isolation is not necessary at one end.

It will be appreciated that, as used herein "lines" of material need not extend in only a single direction through the entire extent of the "lines". Rather, a "line" of material is an elongated run of material and may curve or otherwise change direction over the expanse of the line of material.

In addition, in any of the steps described herein, transferring a pattern from an overlying level to an underlying level involves forming features in the underlying level that generally correspond to features in the overlying level. For example, the path of lines in the underlying level will generally follow the path of lines in the overlying level and the location of other features in the underlying level will correspond to the location of similar features in the overlying level. The precise shapes and sizes of features may vary from the overlying level to the underlying level, however. For example, depending upon etch chemistries and conditions, the sizes of and relative spacings between the features forming the transferred pattern may be enlarged or diminished relative to the pattern on the overlying level, while still resembling the same initial "pattern," as can be seen from the example of shrinking the first resist mask in the embodiments described below. Thus, even with some changes in the dimensions of features, the transferred pattern is still considered to be the same pattern as the initial pattern. In contrast, forming spacers around mask features may change the pattern.

Consequently, it will be appreciated from the description herein that the invention includes various embodiments. For example, according to some embodiments of the invention, a method is provided. The method comprises providing a substrate having a loop formed of semiconductor material. The loop is defined by a pair of substantially parallel, horizontally elongated portions joined at at least one loop end. A first transistor along the loop is formed to electrically isolate an expanse of a first of the elongate portions from an expanse of a second of the elongate portions. A part of the loop forms an active area of the first transistor.

According to other embodiments the invention, a process is provided for forming an integrated circuit. The process comprises providing a plurality of mandrels overlying a substrate. A spacers are provided at sidewalls of the mandrels. The mandrels are selectively removed relative to the spacers. A layer of mask material is deposited over the spacers. The layer of mask material is patterned to form first and second laterally-separated blocks of the mask material, the first block contacting a first end of each of the spacers and the second block contacting a second end of each of the spacers. A first pattern defined by the spacers and the first and second blocks are transferred to the substrate.

According to yet other embodiments of the invention, a process for forming an integrated circuit is provided. The process comprises providing a plurality of elongated loops of a first mask material overlying a substrate. A layer of a second mask material is provided over the loops. The layer is patterned to form a block of the second mask material, the block contacting an end of each of the loops. A first pattern defined by the loops and the block is transferred to the substrate. A layer of semiconductor material is subsequently formed over the substrate. An other layer of mask material is formed over the semiconductor material. The other layer is patterned to form one or more strips of masking material extending across and contacting each of the loops. A second pattern defined by the strips is transferred to the layer of semiconductor material to form strips of semiconductor material. The strips of semiconductor material are electrically connected to substrate features defined by the block of the second mask material.

According to other embodiments the invention, an integrated circuit is provided. The integrated circuit comprises a plurality of spaced apart lines of semiconductor material. A first block of the semiconductor material is disposed on a same level as the lines of semiconductor material and contact a first end of each of the elongate strips. A first plurality of transistor gates is disposed along the lines of semiconductor material. The first plurality of transistor gates are electrically connected to the first block.

According to yet other embodiments the invention, an electrical device comprising an integrated circuit is provided. The integrated circuit comprises a plurality of spaced-apart lines of semiconductor material. All of a first end of the lines are electrically interconnected and all of an opposite end of the lines are electrically interconnected. A means for preventing current flow from a mid-portion of the lines to the first end is provided.

It will also be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. An integrated circuit, comprising:
a plurality of loops formed of semiconductor material, each loop being defined by a pair of elongated portions joined at first and second opposing ends of the elongated portions, and each loop having a first pair of associated isolation transistors comprising a first transistor and a second transistor, the first transistor comprising:
a first active area formed in the associated loop;
a first gate disposed over the active area; and
a first source/drain region formed in the associated loop, the first gate and the first source/drain region being shunted together; and
the second transistor comprising:
a second active area formed in the associated loop;
a second gate disposed over the active area; and
a second source/drain region formed in the associated loop, the second gate and the second source/drain region being shunted together.

2. The integrated circuit of claim 1, wherein the first transistor is proximate a first end of the associated loop and the second transistor is proximate a second end of the associated loop.

3. The integrated circuit of claim 2, wherein the first pair of associated isolation transistors is disposed along a first of the elongated portions of each loop,
wherein each loop further has a second pair of associated isolation transistors disposed along a second of the elongated portions of each loop, the second pair of associated isolation transistors comprising a third transistor proximate the first end of the associated loop and a fourth transistor proximate the second end of the associated loop, each isolation transistor of the second pair of associated isolation transistors having a respective source/drain region shunted to a respective transistor gate.

4. The integrated circuit of claim 1, wherein the integrated circuit is a memory device, wherein the loops of semiconductor material each form bit lines.

5. The integrated circuit of claim 1, further comprising a pair of select transistors along each elongated portion, a first select transistor of the pair of select transistors proximate a first end of the associated loop and a second select transistor of the pair of select transistors is proximate the second end of the associated loop.

6. The integrated circuit of claim 5, further comprising a plurality of floating gate transistors disposed along each elongated portion and between each pair of select transistors.

7. The integrated circuit of claim 1, wherein ends of the loops extend into a periphery region of the integrated circuit.

* * * * *